United States Patent [19]

Nakajima

[11] Patent Number: 5,295,096
[45] Date of Patent: Mar. 15, 1994

[54] NAND TYPE EEPROM AND OPERATING METHOD THEREFOR

[75] Inventor: Moriyoshi Nakajima, Hyogo, Japan

[73] Assignee: Mitsubishi Denki Kabushiki Kaisha, Tokyo, Japan

[21] Appl. No.: 905,191

[22] Filed: Jun. 26, 1992

Related U.S. Application Data

[63] Continuation of Ser. No. 638,153, Jan. 9, 1990, abandoned, which is a continuation of Ser. No. 377,935, Jul. 11, 1989, abandoned.

[30] Foreign Application Priority Data

Jul. 11, 1988 [JP] Japan .................. 63-173402

[51] Int. Cl.$^5$ .......................... G11C 11/34
[52] U.S. Cl. .................. 365/185; 365/218; 365/900
[58] Field of Search ........... 365/185, 218, DIG. 900, 365/184, 182, 104

[56] References Cited

U.S. PATENT DOCUMENTS

| | | | |
|---|---|---|---|
| 4,580,247 | 4/1986 | Adam | 365/185 |
| 4,939,690 | 7/1990 | Momodomi et al. | 365/185 |
| 4,959,812 | 9/1990 | Momodomi et al. | 365/185 |
| 4,962,481 | 10/1990 | Choi et al. | 365/185 |

FOREIGN PATENT DOCUMENTS

| | | | |
|---|---|---|---|
| 69592 | 4/1982 | Japan | 365/185 |
| 71587 | 5/1982 | Japan | 365/185 |
| 182162 | 9/1985 | Japan | 365/185 |

OTHER PUBLICATIONS

Gupta et al, "5-V-only EEPROM," Electronics, vol. 51, No. 3 Feb. 10, 1982, pp. 121–125.

"A High Density EPROM Cell and Array" by Stewart et al., Symposium on VSLI Tech. Digest of Technical Papers, May 1986, VII-9, pp. 89–90.

"New Ultra High Density EPROM and Flash EEPROM with NAND Structure Cell" by Masuoka et al, IEDM Technical Digest, Dec. 1987 pp. 552–555.

"A New NAND Cell for Ultra High Density 5V-Only EEPROMs", R. Shirota et al, Digest of Technical Papers of the Symposium on VLSI Technology. May 10, 1988.

*Primary Examiner*—Joseph L. Dixon
*Assistant Examiner*—Michael A. Whitfield
*Attorney, Agent, or Firm*—Lowe, Price, LeBlanc & Becker

[57] ABSTRACT

An improved NAND type EEPROM is disclosed, in which one selecting transistor and a plurality of memory transistors constituting one memory block are connected in series, a tunnel region for writing/erasing signal charges is isolated from a read transistor region for reading presence/absence of stored charge in each of the memory transistors. The plurality of memory transistors share one selecting transistor and the read transistor region and the selecting transistor region are isolated from each other, so that the memory block can be made small and the threshold values of the plurality of memory transistors are not influenced by the number of the memory transistors.

9 Claims, 22 Drawing Sheets

| LINE | | E | P | R |
|---|---|---|---|---|
| B | B1 | L | H | 1V |
| | B2 | L | L | 1V |
| S | S1 | L | Floating | L |
| | S2 | L | Floating | L |
| W | W1 | H | H | 5V |
| | W2 | L | L | L |
| C | C11 | H | L | L |
| | C12~C18 | L | M | 5V |
| | C21~C28 | L or Floating | L or Floating | L |

L = 0V, H; Vpp = 18V, M = 5~10V

FIG.8

| LINE | | BYTE ERASE | BYTE PROGRAM | BYTE READING |
|---|---|---|---|---|
| A | A | H | L | L |
| | A2~A8 | L | M | 5V |
| | | | | |
| S | S11 | L | Floating | L |
| | S12~S18 | L | Floating | L |
| | S21~Sℓ8 | L | L/Floating | L |
| W | W1 | H | H | 5V |
| | W2~W12 | L | L | L |
| Y | Y1 | H | H | 5V |
| | Y2~Yℓ | L | L | L |
| B | B11 | L | L | 1V |
| | B12 | | H | |
| | B13 | | H | |
| | B14 | | L | |
| | B15 | | L | |
| | B16 | | H | |
| | B17 | | L | |
| | B18 | | H | |
| | B21~ℓ8 | L | L | L |

H : Vpp ≃ 18V
M : 5~10V
L : 0V

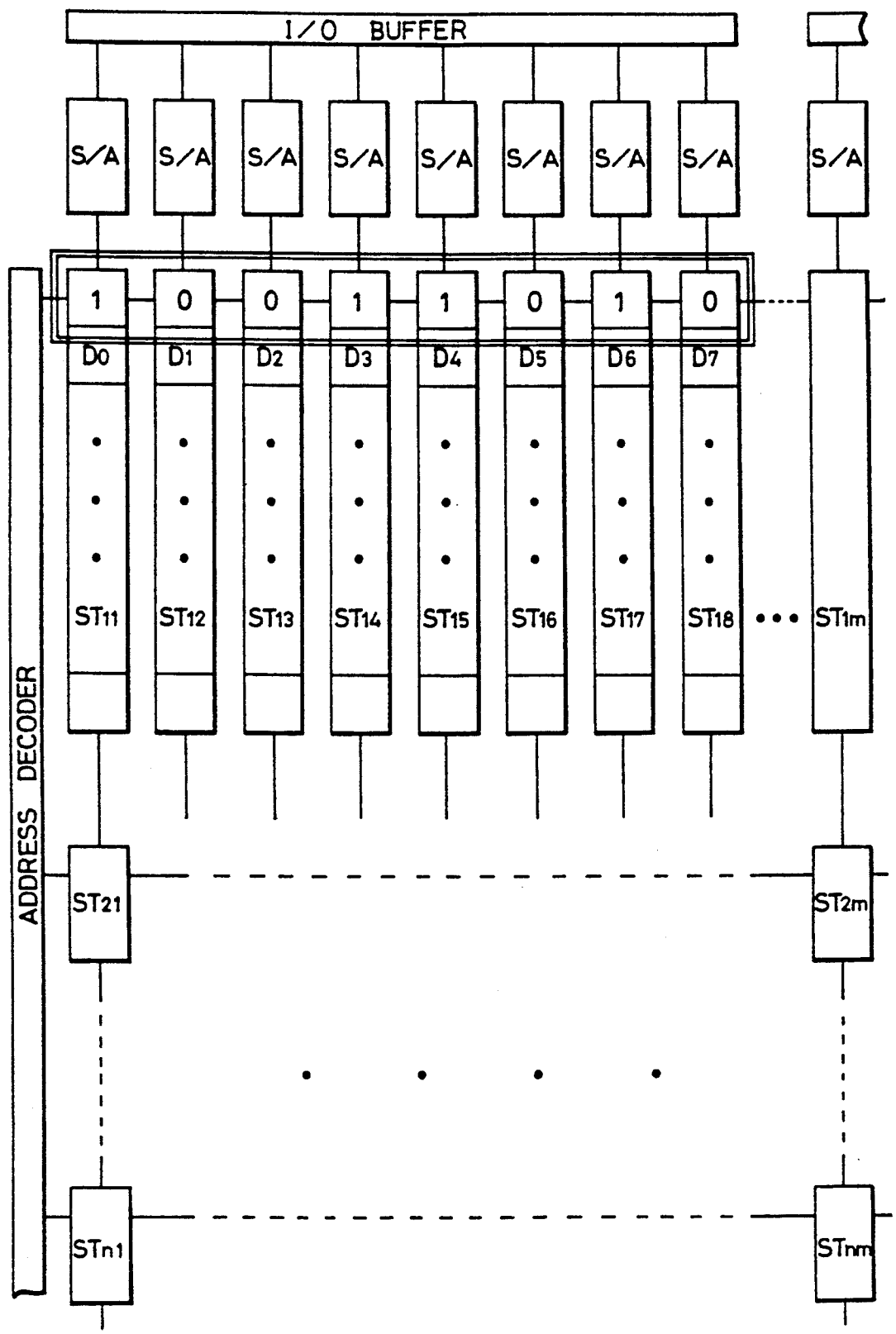

|  |  | ERASE | WRITE | READ |
|---|---|---|---|---|
| 31 |  | 0 V | 20 V | 5 V |
| 3 |  | 5 V | 20 V | 5 V |
| BIT1 | 6 | 13 V | 20 V | 5 V |
| BIT2 | 6 | 13 V | 20 V | 5 V |
| BIT6 | 6 | 13 V | 20 V | 5 V |
| BIT7 | 6 | 13 V | 0 V | 0 V |
| BIT8 | A | 13 V | 0 V | 5 V |
| 33 |  | 5 V | 0 V | 5 V |

NAND TYPE EEPROM AND OPERATING METHOD THEREFOR

This application is a continuation of U.S. application Ser. No. 07/638,153 filed Jan. 9, 1991, now abandoned. This application is a continuation of application Ser. No. 07/377,935 filed Jul. 11, 1989, now abandoned.

BACKGROUND OF THE INVENTION

1. Field of the Invention

The present invention relates generally to an electrically erasable and programmable read only memory (hereinafter referred to as an EEPROM) and, more specifically, to an EEPROM of a NAND type and an operating method therefor.

2. Description of the Related Art

An EEPROM is usually used as a memory unit for a microcomputer.

FIG. 13 is a block diagram showing a known conventional EEPROM capable of writing/erasing electric information therein.

Referring to FIG. 13, the EEPROM comprises a memory array 50 including EEPROM cells; a row address buffer 51 receiving external row address signals; a column address buffer 52 receiving column address signals; a row decoder 53 and a column decoder 54 for decoding these address signals to provide a voltage to a word line and a bit line connected to a specified memory cell; a sense amplifier 56 for reading a signal stored in the memory cell designated by the two decoders through a column select gate 55; an output buffer 57 for outputting the read signal; and a control signal input buffer 58 receiving an external control signal to apply the same to each of the above mentioned portions.

In operation, the sense amplifier 56 amplifies a signal stored in a memory cell and applies the same to the output buffer 57. FIG. 14 is a schematic diagram showing examples of the memory array 50 and the column select gate 55 shown in FIG. 13.

Referring to FIG. 14, the column select gate 55 comprises a transistor 60 connected between an I/O line 59 and a bit line 31, and a transistor 63 connected between a CG line 61 and a control gate line 62. A column select gate signal Y2 is applied to the gates of the transistors 60 and 63. Transistors to which a column select gate signal Y1 is applied are connected in the similar manner.

4 bit memory cells are shown in the memory array 50. One memory cell comprises a memory transistor 6 having a floating gate and a selecting transistor 3 having its gate connected to a word line 32 for applying a signal stored in the memory transistor 6 to the bit line 31. Another selecting transistor 3a has its gate connected to the word line 32 and it is connected to apply a signal on the control gate line 62 to the gate of the memory transistor 6.

In operation, the memory transistor 6 stores a binary signal dependent on whether or not electrons are stored in the floating gate thereof. When electrons are stored, threshold voltage of the memory transistor 6 becomes high. Consequently, in the reading operation, the memory transistor 6 turns off. When electrons are not stored, the threshold voltage of the memory transistor 6 becomes negative. Consequently, the memory transistor 6 turns on in the reading operation.

A reading voltage from the sense amplifier is applied to the bit line 31 through the transistor 60 and it is further applied to the memory transistor 6 through the selecting transistor 3. Consequently, whether a current flows or not through the memory transistor 6 can be detected in the sense amplifier, whereby a signal stored in the memory transistor 6 can be read.

FIG. 15A is a plan view of a conventional EEPROM having a floating gate. FIG. 15B shows a cross sectional structure taken along the line XVB—XVB of FIG. 15A. The structure of the EEPROM will be described with reference to FIGS. 15A and 15B.

The EEPROM comprises a memory transistor 6 formed on a main surface of a P type silicon semiconductor substrate 20, and a selecting transistor 3. The memory transistor 6 comprises a tunnel impurity diffused region 9 formed on the main surface of the semiconductor substrate 20 which will be the drain region, a source region 2, a thin tunnel insulating film 16 formed on a prescribed region of the tunnel impurity diffused layer 9, a floating gate 14 formed of polysilicon on a region of the semiconductor substrate 20 including at least the tunnel insulating film 16 with an insulating film disposed therebetween, and a control gate 7 formed on the floating gate 14 with an interlayer silicon oxide film 15 disposed therebetween. The control gate 7, the floating gate 14 and the interlayer silicon oxide film 15 therebetween constitute a capacitor at a region in which they overlap with each other. The floating gate 14, the tunnel impurity diffused layer 9 connected to an impurity diffused layer 5 for connection and the tunnel insulating film 16 form a capacitor. In addition, the floating gate 14, the semiconductor substrate 20 and the insulating film near the tunnel insulating film 16 form a capacitor, except in the region of the tunnel insulating film 16. The floating gate 14 stores charges. Charging/discharging of the electric charges is carried out between the floating gate 14 and the tunnel impurity diffused layer 9 through the tunnel insulating film 16 in accordance with a voltage applied between the control gate 7 and the impurity diffused layer 5 for connection. The selecting transistor 3 comprises the impurity diffused layer 5 for connection and the drain region 1 formed spaced apart from each other on the main surface of the semiconductor substrate 20, and a selecting gate electrode 4 formed therebetween, which will be the word line. A selecting gate silicon oxide film 13 is formed between the selecting gate electrode 4 and the main surface of the semiconductor substrate 20. The drain region 1 is connected to the bit line 31 through a contact hole.

The selecting transistor 3 turns on/off in response to a signal applied through the selecting gate electrode 4. Consequently, the information stored in the memory transistor 6 connected to the selecting transistor 3 is read to the bit line 31.

The operation of the EEPROM will be described in the following. The EEPROM has three basic operation modes of reading, erasing and writing.

The table below shows voltages applied to respective elements in writing, erasing and reading charges representing information of the floating gate 14.

| ELEMENTS | READ | ERASE | WRITE |
|---|---|---|---|
| SELECTING GATE ELECTRODE 4 | 5V | $V_{PP}$ | $V_{PP}$ |
| CONTROL GATE 7 | 0V | $V_{PP}$ | 0V |
| BIT LINE 31 | 2V | 0V | $V_{PP}$ |
| SOURCE LINE 12 | 0V | 0V | FLOATING |
| FLOATING GATE 14 | $V_F$ | $V_E$ | $V_W$ |

In the table, $V_{PP}$ represents a programming voltage, $V_F$ represents a potential in a floating state, and $V_W$ and $V_E$ represent potentials of the floating gate 14 in respective operations.

As shown in the table, 5V is applied to the selecting gate electrode 4 in reading, 2V is applied to the bit line 31, and the control gate 7 and the source line 12 are grounded. In this condition, if the memory transistor 6 turns on or not is dependent on the potential of the floating gate 14. Therefore the condition of the floating gate 14 is decided by detecting the current flow of the source line 12. In erasing the memory cell, $V_{PP}$ is applied to the selecting gate electrode 4, while the bit line 31 and the source line 12 are grounded. In the erasing cycle, negative charges are applied to the floating gate 14. In writing, $V_{PP}$ is applied to the selecting gate electrode 4 and to the bit line 31, the control gate 7 is grounded and the source line 12 is kept at a floating state. Consequently, positive charges are introduced to the floating gate 14 to change the threshold voltage of the memory transistor 6.

FIGS. 16A and 16B are equivalent circuit diagrams of the EEPROM shown in FIGS. 15A and 15B. The reference character $C_1$ represents a tunnel capacitance formed in the tunnel region. $C_2$ represents a capacitor formed by the floating gate 14, the control gate 7 and the interlayer silicon oxide film 15 disposed therebetween. $C_3$ represents a parasitic capacitance formed by the floating gate 14 out of the tunnel region, the tunnel impurity diffused layer 9 formed therebelow and the tunnel insulating film 16 formed therebetween. An equivalent circuit in the erasing mode is shown in FIG. 16B. In this case, the potential $V_F$ at the point F will be represented by the following equation, $$V_F = \frac{C_2}{C_1 + C_2 + C_3} V_{PP} \quad (1)$$

where $\frac{C_2}{C_1 + C_2 + C_3}$ is capacitive coupling ratio which is normally about 0.7. The electric field of the tunnel insulating film and the current flowing through the tunnel insulating film will be represented by the following equations.

$$E_{OX} = \frac{V_F}{T_{OX}} \quad (2)$$

$$J = A E_{OX}^2 \exp(B/E_{OX}) \quad (3)$$

where
$E_{OX}$ represents thickness of the tunnel insulating film,
J represents a current density value, and
A and B represent constants.

By substituting the equation (2) by (1) with the capacitive coupling ratio 0.7 and $T_{OX}$ being 10 nm, $E_{OX}=14$MV/cm. By substituting the equation (3) with this value, a considerably large value of J is provided. Electrons are discharged/charged between the floating gate and the impurity region on the substrate by using the value of the electric field.

An overview of the conventional EEPROM has been described in the foregoing.

The conventional EEPROM was structured as described above. One memory cell must have one memory transistor, one transfer transistor and a set of source and drain electrodes, so that it is difficult to minimize the size of the cell.

One example of an EEPROM in which such drawbacks of the conventional EEPROM are eliminated is disclosed in "A New NAND Cell for Ultra High Density 5V-Only EEPROMs" R. Shirota et. al. Digest of Technical Papers for Symposium on VLSI Technology.

FIG. 17 is a plan view showing 1 byte of memory cells of the prior NAND type EEPROM disclosed therein. FIG. 18 is a cross sectional view of a portion taken along the line XIIX—XIIX of FIG. 17. Referring to FIGS. 17 and 18, the conventional NAND type EEPROM comprises a P type semiconductor substrate 20, a plurality of 1 byte of memory transistors 6 formed connected in series on the main surface of the substrate, a selecting transistor 3 for selecting the plurality of 1 bit of memory transistors as a whole formed on one end of the memory transistors 6 and a second selecting transistor 33 for applying a constant potential to the 1 byte of memory transistors. The memory transistor 6 comprises $n^+$ impurity regions 34 which will be the source and the drain formed spaced apart from each other on the main surface of the semiconductor substrate 20, a floating gate 14 formed on a channel region sandwiched by the source and drain regions with a gate insulating film 35 disposed therebetween, and a control gate 7 formed on the floating gate 14 with an interlayer silicon oxide film 15 disposed therebetween. The gate insulating film 35 comprises a tunnel region 8 to cause Fowler-Nordheim tunnelling phenomenon (hereinafter simply referred to as F-N tunnelling phenomenon) between a tunnel impurity diffused layer 9 and the floating gate 14. The second selecting transistor 33 connects the 1 byte of memory cells to the ground through a source line 12.

FIG. 19 is an equivalent circuit diagram of the prior NAND type EEPROM shown in FIG. 17. 8 single bit memory transistors 6 constituting 1 byte are selected by one selecting transistor 3. The drain of the selecting transistor 3 is connected to the bit line 31. The control gates 7 of the memory transistors 6 are independent from each other and various voltages are applied thereto corresponding to the writing/reading of data. Each bit corresponds to the plan view of FIG. 17, and one example of such correspondence is represented by arrows in the figure.

FIG. 20 shows voltages applied to the control gate 7 of each memory transistor 6, the bit line 31 connected to the memory of 1 byte, the selecting transistor 3 and to the second selecting transistor 33 in writing data, erasing data and reading data to and from each of the memory transistors in the equivalent circuit shown in FIG. 19. Referring to FIG. 20, the operation of the prior art NAND type EEPROM will be described. It is assumed that the memory transistor represented by the arrow A is selected. In order to erase signals of all the bits of 1 byte, 13V is applied to all control gates 7 and 0V is applied to the bit line 31. Memory cells constituting a NAND column are erased in the order of the series connection of 1 byte. In depletion writing (usually called as "write" mode), 20V is applied to the control gates 7 between the selected bit line and the non selected memory transistor. 0V is applied to the control gate of the selected memory transistor and to the control gates of the non selected memory transistors which are between the selected memory transistor and the source region. Consequently, depletion writing is carried only on the selected bits. In a reading, 5V is applied to all non selected control gates. When the selected bit has been depleted, that portion becomes conductive. Consequently, presence/absence of a signal can be determined.

FIG. 21 shows changes of the threshold values of the memory transistors 6 when writing is carried out sequentially from the Bit 8 to the Bit 1 shown in FIG. 19. Since the writing is carried out sequentially, the absolute value of the threshold value increases as the writing proceeds from the Bit 8 to the Bit 1. Threshold value changes as a result of the change of the bulk resistance in the channel region.

Data reading operation of a conventional NAND type EEPROM having a serial byte structure (an EEPROM in which 1 byte comprises serially connected 8 memory cells) will be described in the following with reference to FIGS. 22 and 23. A plurality of strings ST are arranged in a matrix. The sense amplifier is provided for every line of strings arranged in the vertical direction. Each string ST stores 1 byte data. For example, the string $ST_{11}$ surrounded by double solid lines store 8 bit data of $D_0$ to $D_7$. In the conventional NAND type EEPROM having the serial byte structure, writing/erasing is carried out sequentially in 8 cells connected in series in the direction of the bit line, as described above. Therefore, 1 byte must be arranged in series in one string.

The prior NAND type EEPROM structured as described above exhibits the following drawbacks.

First, it is presumed that the prior NAND type EEPROM has its tunnel region formed on the channel region, as shown in FIGS. 17 and 18. Therefore, the programming voltage applied to the memory transistor near the source is lowered by the channel resistance and the threshold value of other memory transistors. Consequently, writing cannot be fully carried out, and the threshold values of the memory transistors in one NAND type memory cell differ from each other. This is apparent from FIG. 21. For example, the threshold value of Bit 8 is $-2V$ while the threshold value of Bit 1 is $-6V$. The difference of about 4V is generated in 1 byte. This means that the threshold values of all the memory cells in 1 byte are influenced by the threshold value of Bit 8 in manufacturing the memory cell, and therefore the reliability of the manufactured memory cells may be lowered. If the absolute value of the threshold becomes much larger than desired, the tunnel oxide film is degraded rapidly, shortening the life of the EEPROM because high voltage (such as 20V) has to be applied to the drain region adjacent to the memory transistor 6 to be written as shown in FIG. 20.

As shown in FIG. 20, 2 0V is applied to the control gates, that is, the word lines of the non-selected transistors from the drain to the selected memory transistor in writing. On this occasion, memory cells adjacent to the memory transistors to which 2 0V is applied are influenced. More specifically, the programming voltage $V_{OPP}=20V$ is applied not only to the non-selected word lines of the memory cells constituting a selected column but also to the gates of the transistor of the memory cells constituting a column not selected, corresponding one directly adjacent to the one with non-selected word line. There is a possibility of erroneous writing in a memory transistor intersecting the non-selected selected bit line which is at a different low level. In order to prevent the above mentioned erroneous writing when a high voltage is applied to a non-selected word line, an intermediate potential must be applied to all the non-selected bit lines. The 1 byte data arranged in series can only be read sequentially, as shown in FIG. 23. Therefore, the time required for reading is 8 times or more than that of reading 1 bit data. Namely, the reading of data requires much time.

In addition, since the tunnel region is formed on the channel, it becomes difficult to form diffused layers on both sides of the channel. Namely, the channel length cannot be determined in a self-alignment manner. Therefore, complicated processes such as overlapping of masking and so on are needed to form the tunnel region such as described above.

SUMMARY OF THE INVENTION

Therefore, one object of the present invention is to realize miniaturization and higher degree of integration and to make uniform operational characteristics in an EEPROM.

Another object of the present invention is to prevent changes of threshold values of memory cells in an NAND type EEPROM.

A further object of the present invention is to prevent an applied voltage for writing and for erasing from influencing other memory cells in an NAND type EEPROM.

A still further object of the present invention is to carry out reading of 1 byte data in a short time period in an NAND type EEPROM.

A still further object of the present invention is to form 1 byte in a direction different from the direction of the NAND column in a NAND type EEPROM.

A still further object of the present invention is to enable writing and erasing in a direction different from the direction of the NAND column in a NAND type EEPROM.

A still further object of the present invention is to access at random rather than sequentially the memory cells constituting the NAND column in a NAND type EEPROM.

A still further object of the present invention is to shorten an access time to a memory cell in a NAND type EEPROM.

A still further object of the present invention is to provide a simple method of manufacturing a NAND type EEPROM.

A still further object of the present invention is to extend life of a NAND type EEPROM.

A still further object of the present invention is to shorten the access time in an operating method of a NAND type EEPROM.

The above described objects of the present invention can be attained by a NAND type electrically erasable programmable read only memory, comprising: a semiconductor substrate having a main surface; a first plurality of memory cells connected in series on the main surface of the substrate, each cells having a floating gate for storing charges representing information; and selecting device for selecting a group of the memory cells; each memory cells having a floating gate state changing device for changing the state of the floating gate between a first state and a second state; floating gate state determining device for determining whether the floating gate is in the first state or the second state; and device for establishing a current flow path through the floating gate state determining device for reading the floating gate state, the current flow path bypassing the floating gate state changing device.

Since the EEPROM comprises the above described components, a plurality of memory cells share one selecting device. Therefore, the memory cell itself can be made small. In addition, since the floating gate state changing device and the floating gate state determining device are provided independent from each other, a value for generating the change of the state of the plurality of memory cells can be kept constant, independent from the influence of the number of series connected memory transistors.

Consequently, miniaturization and higher degree of integration can be realized in a NAND type EEPROM and the operational characteristics can be made uniform.

According to a preferred embodiment of the present invention, the floating gate state changing device comprises a tunnel insulating film connected to a first potential formed on the main surface of the semiconductor substrate and a control gate connected to a second potential formed on the floating gate with an insulating film disposed therebetween, and the floating gate state changing device sets the floating gate at the first state by setting the second potential at a prescribed potential higher than the first potential and sets the floating gate at the second state by setting the first potential at a prescribed potential higher than the second potential, and applies a third potential which is an intermediate potential between the first and second potentials to the control gate when the floating gate should not be changed to the first or second state.

Since the NAND type EEPROM comprises the above described components, an intermediate potential between the first and second potentials is applied to the control gate of a memory cell in which the state of the floating gate is not changed. Namely, different voltages are applied to the memory cells in which the states of the floating gates are changed and to the memory cells in which the states of the floating gates are not changed. Consequently, the voltage applied to the memory cells in which the state of the floating gates are changed for writing or erasing does not influence the memory cells in which the states of the floating gate are not changed.

According to another aspect of the present invention, a method of addressing a NAND type EEPROM comprising a semiconductor substrate having a main surface; an array of memory cells comprising a plurality of groups of memory cells, each group including a number of memory cells connected in series path on the main surface of the substrate, each cells having a floating gate for storing charges representing information, each memory cell having floating gate state changing device for changing the state of the floating gate between a first charge state and a second charge state; and floating gate state determining device for determining whether the floating gate is in the first charge state or the second charge state; the floating gate state changing device and said floating gate state determining device being non-overlapping with each other on said substrate, the method comprising the steps of: addressing simultaneously corresponding memory cells in at least two of the groups of memory cells, the memory cells addressed thereby forming a byte of memory cells; and processing information in the byte of memory cells.

Since a method of addressing a NAND type EEPROM includes above described steps, at least two of the groups of memory cells are selected and the information thereof is processed simultaneously. Therefore, an operating method of an NAND type EEPROM capable of shortening the access time.

The foregoing and other objects, features, aspects and advantages of the present invention will become more apparent from the following detailed description of, the present invention when taken in conjunction with the accompanying drawings.

BRIEF DESCRIPTION OF THE DRAWINGS

FIG. 8 shows voltages applied to the respective portion in respective operation modes in the EEPROM shown in FIG. 6;

FIG. 10 is a block diagram of an EEPROM memory cell circuit having a parallel byte structure in accordance with the present invention;

DESCRIPTION OF THE PREFERRED EMBODIMENTS

I. Structure of an NAND type EEPROM in accordance with the present invention.

Figure 15A:
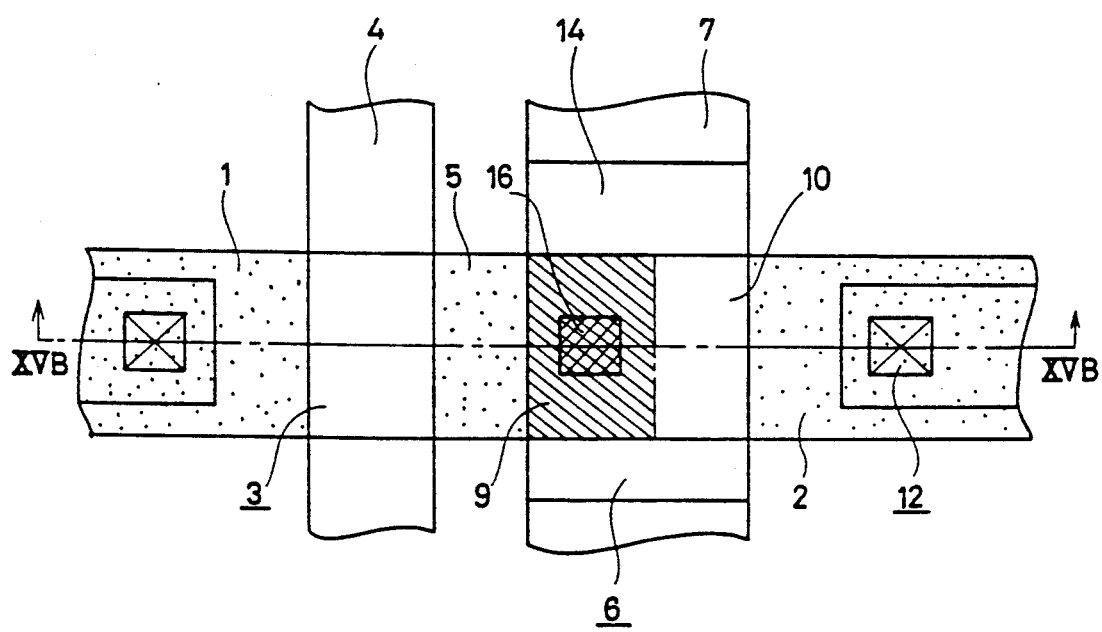
FIG. 15A is a plan view of a conventional EEPROM cell.
Figure 15B:
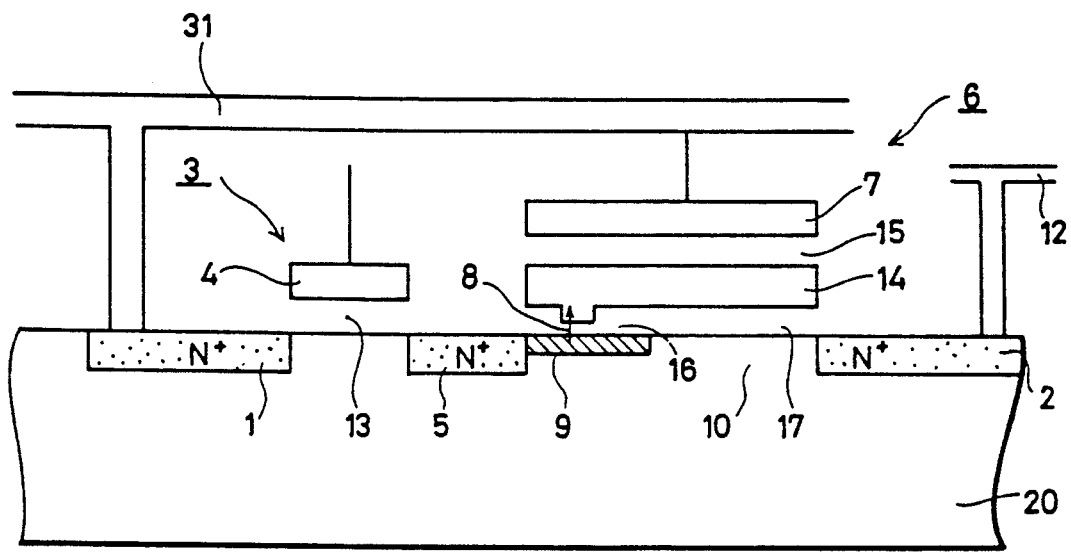
FIG. 15B is a cross sectional view of a portion taken along the line XVB—XVB of FIG. 15A.
Figure 16A:
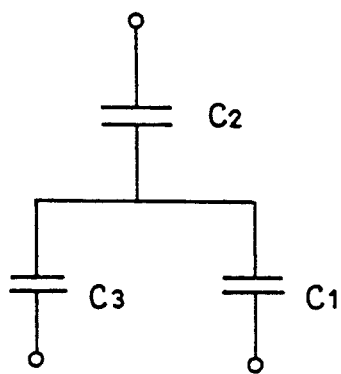
FIGS. 16A and 16B are equivalent circuit diagrams of the EEPROM in FIG. 15B.
Figure 16B:
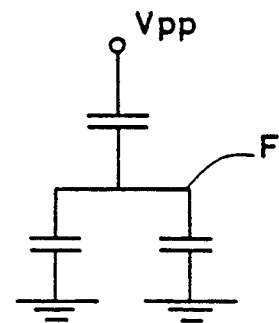
Figure 17:
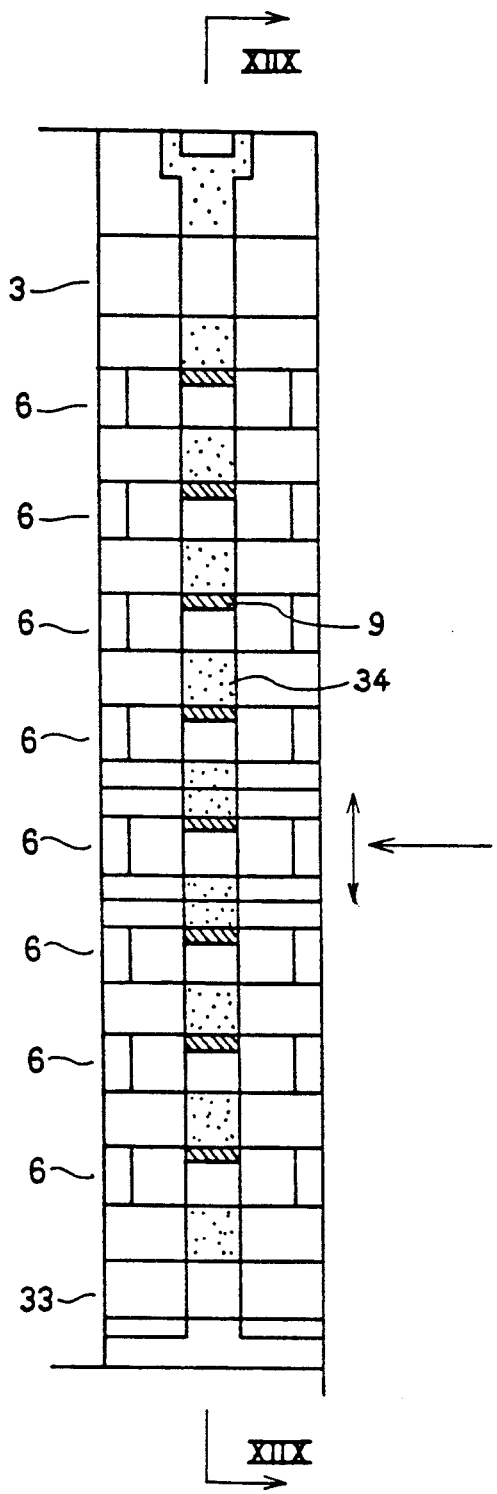
FIG. 17 a plan view showing memory cells of 1 byte of a conventional NAND type EEPROM.
Figure 19:
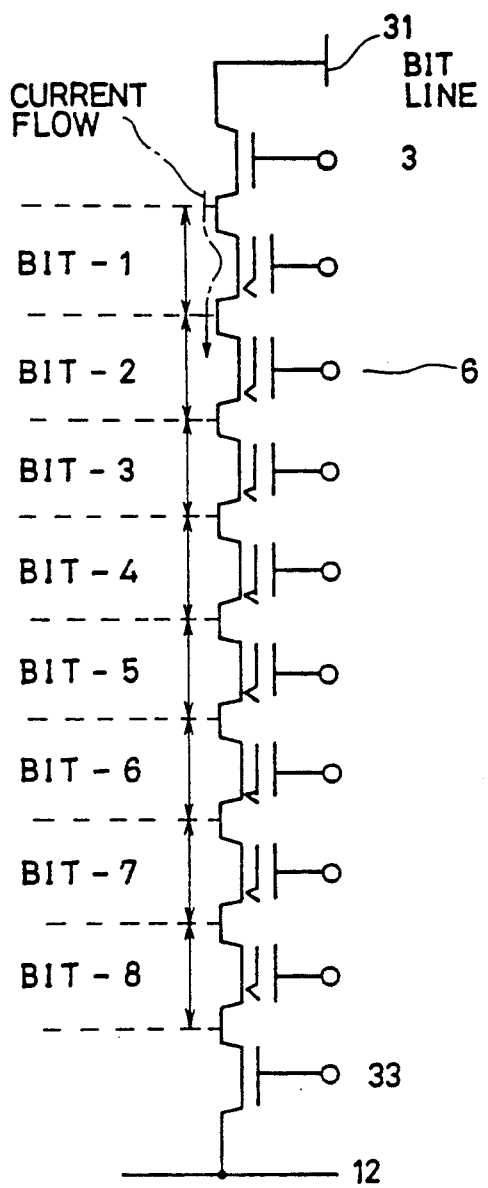
FIG. 19 is a cross sectional view of a portion taken along the line XIIX—XIIX of FIG. 17.
Figure 18:
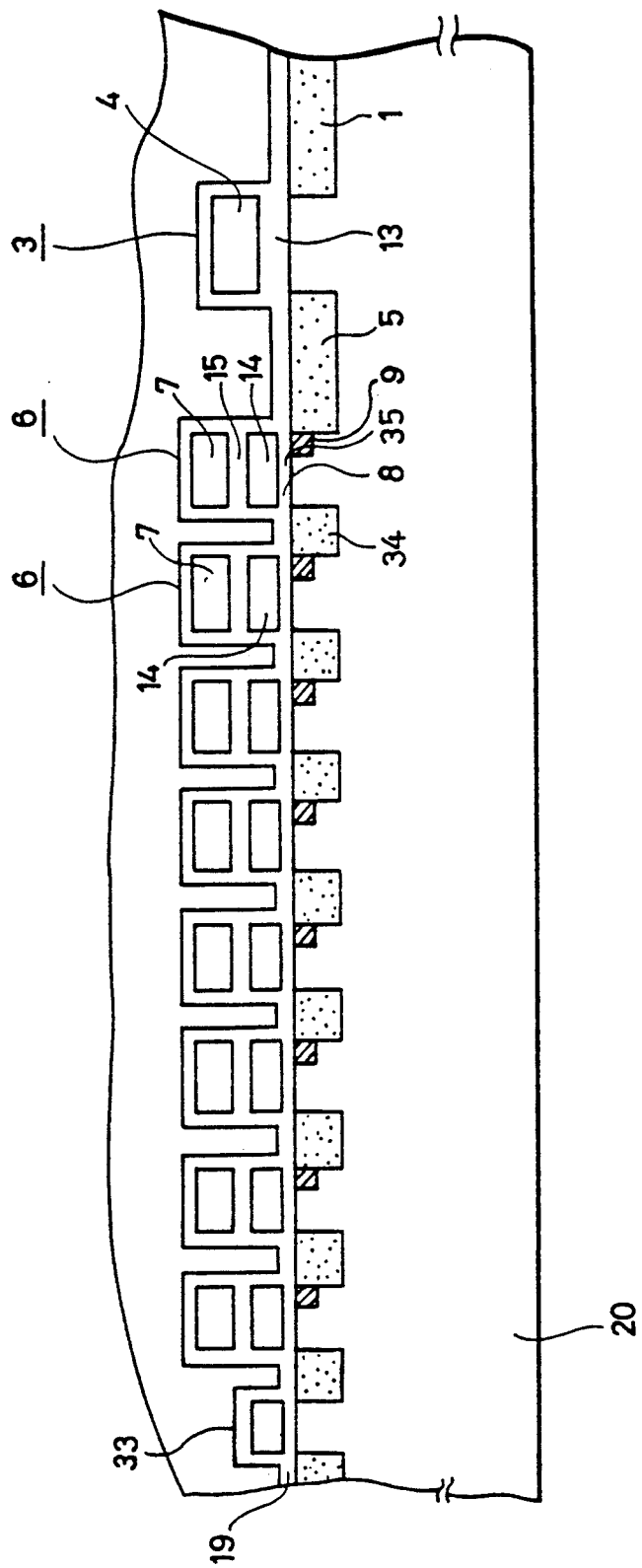
FIG. 18 is an equivalent circuit diagram of the conventional NAND type EEPROM.
Figures 20, 21:
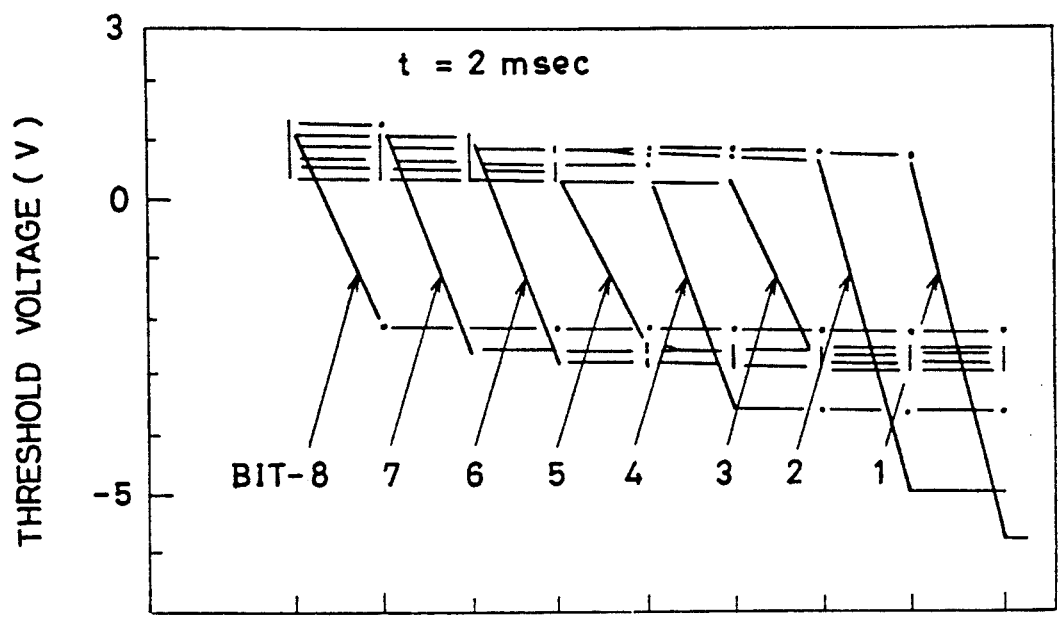
FIG. 20 shows operational voltages of the conventional NAND type EEPROM.
FIG. 21 shows a change of a threshold value of each memory transistor in the conventional NAND type.
Figure 22:
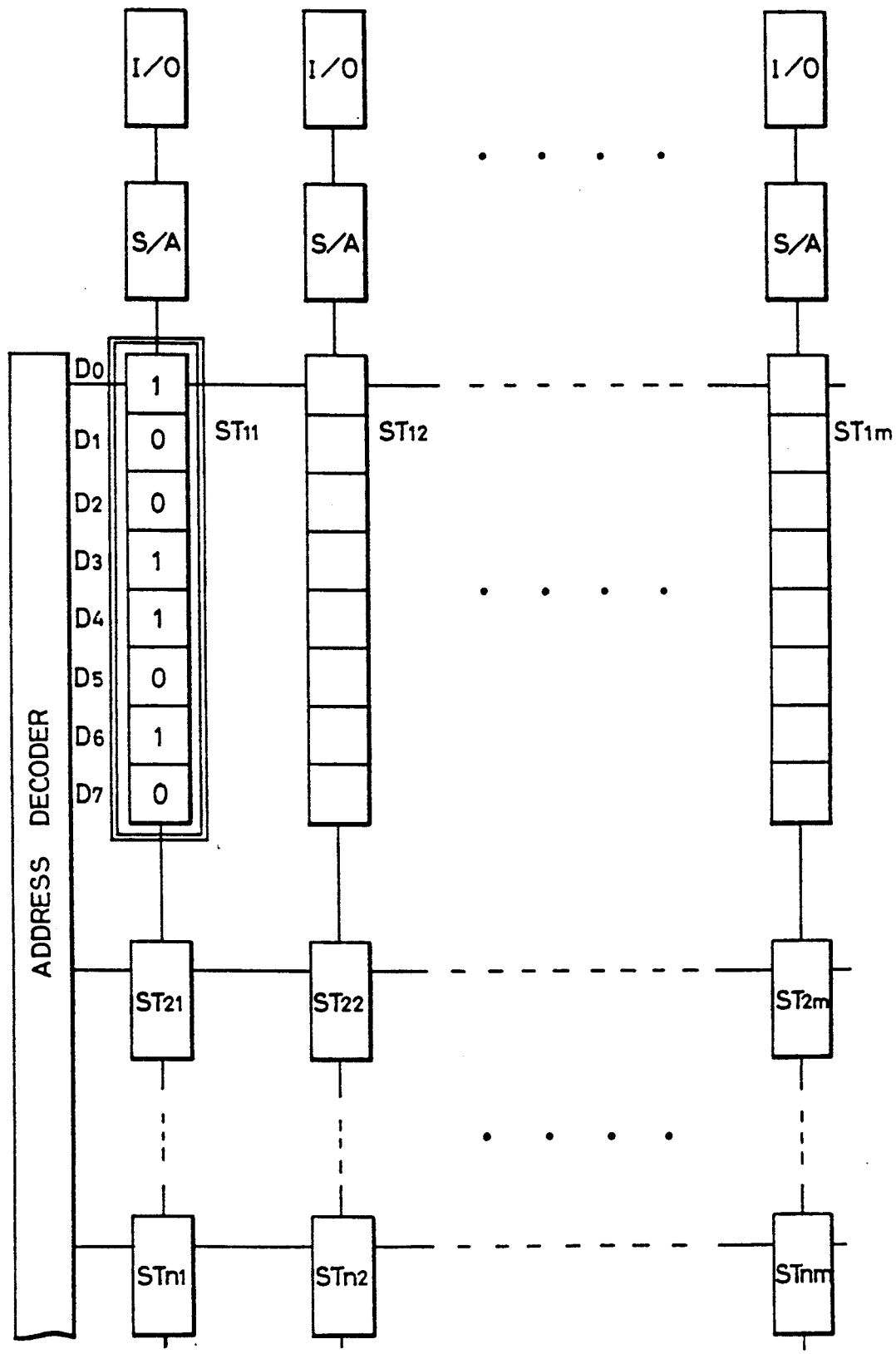
FIG. 22 is a block diagram showing a conventional NAND type EEPROM having the serial byte structure.

Referring to FIGS. 1A to 1D, the NAND type EEPROM in accordance with the present invention comprises 8 one bit memory transistors 6 formed in series on the main surface of a P type semiconductor substrate, a selecting transistor 3 for connecting an 8-bit memory transistor formed on one end of the memory transistors 6 to the drain electrode 11 and a source line 12 connected to the other end of the memory transistors 6. Each of the memory transistors 6 comprises a read transistor region 10 and a tunnel impurity diffused layer 9. In the source-drain direction, memory transistors are isolated by memory connecting impurity diffused layers 22 formed on the main surface of the semiconductor substrate 20 and in the direction orthogonal thereto they are isolated by field oxide films 23 for isolating elements. The read transistor region 10 and the tunnel impurity diffused layer 9 are separated from each other by a field silicon oxide film 21 for isolating regions. Tunnel impurity diffused layer 9, control gate 7, floating gate 14, interlayer oxide film 15 and tunnel insulating film 16 cooperate together to constitute a floating gate state changing device. The flating gate state changing device is used to control the read, write and erase operation of the subject memory device. Each memory transistor 6 comprises a floating gate formed on the main surface with a first gate silicon oxide film 17 disposed therebetween and a control gate 7 formed on the floating gate 14 with an interlayer silicon oxide film 15 disposed therebetween. A tunnel insulating film 16 to cause Fowler-Nordheim (F-N) tunnelling is provided between the tunnel impurity diffused layer 9 and the floating gate 14. The reference numerals 1 to 20 represent the same components as described with reference to the conventional EEPROM shown in FIGS. 15A and 15B. In the prior art, only one memory transistor 6 is arranged between a set of a drain region 1 and a source region 2. Control gate 7, floating gate 14, first gate oxide silicon film 17 and memory connected impurity diffused layer 2 cooperates together to constitute a flating gate state determining device. This device is used for reading out data from the subject memory. In the present invention, a plurality of memory transistors 6 are arranged, and therefore there are a plurality of the same portions. The EEPROM in accordance with the present invention comprises field silicon oxide films 21 for isolating regions for isolating the tunnel region 8 and the read transistor region 10 in each of the memory transistors 6, memory connecting impurity diffused layers 22 for electrically connecting adjacent memory transistors 6 with each other and field oxide films 23 for isolating elements for isolating memory transistors 6 arranged next to each other in the direction of extension of the control gate 7 and the selecting gate electrode 4. A plurality of memory transistors 6 and a plurality of read transistor region 10 arranged between a set of a drain region 1 and a source region 2 constitute one memory block 24. All of the read transistor regions 10 between drain 1 and source 2, all of the memory impurity diffused layer 22 between drain 1 and source 2, including control gate 7, floating gate 14 and first gate oxide film 17 (between drain 1 and source 2) cooperate together to constitute a device for inducing current in the floating gate state determining device. This device for inducing current is necessary for the selectable, bit-by-bit read out of the memory device.

Figure 1A:
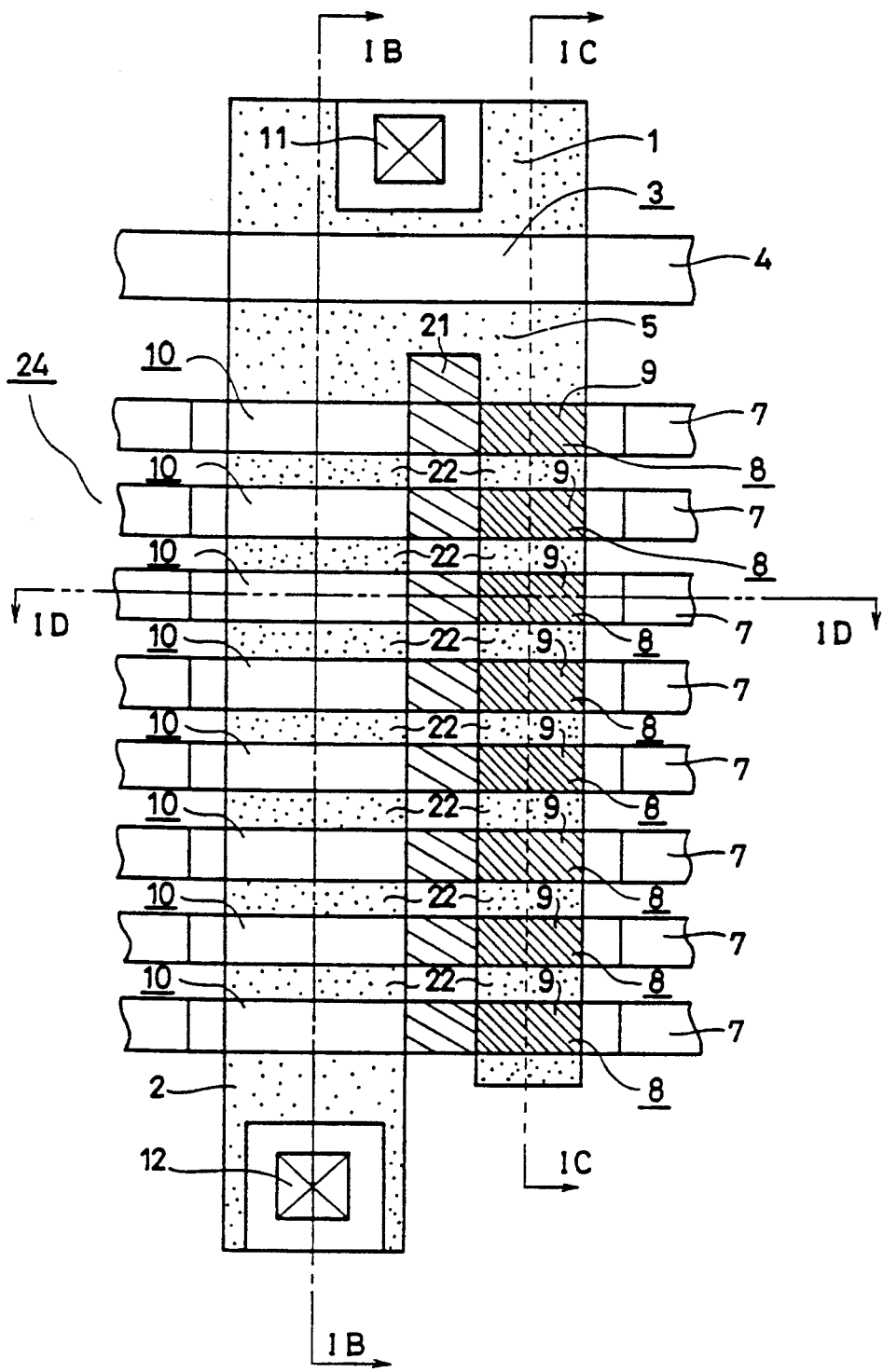
FIG. 1A a plan view showing one embodiment of the present invention.
Figure 1B:
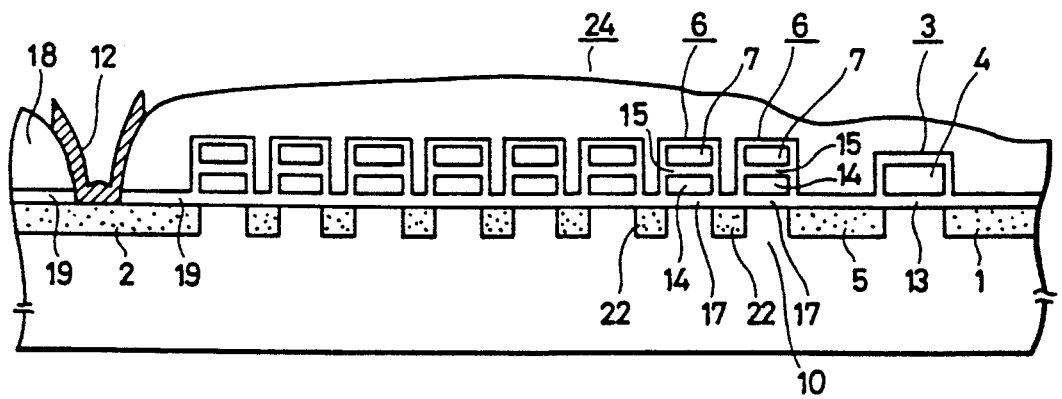
FIG. 1B is a cross sectional view showing a portion taken along the line IB—IB of FIG. 1A.
Figure 1C:
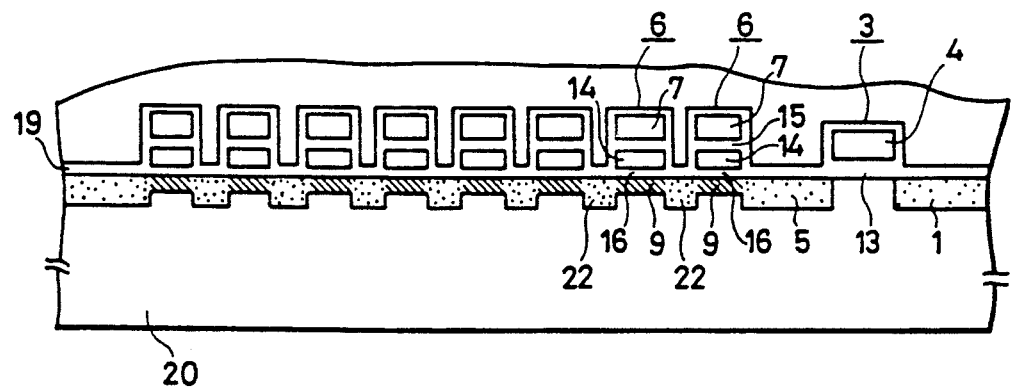
FIG. 1C is a cross sectional view showing a portion taken along the line IC—IC of FIG. 1A.
Figure 1D:
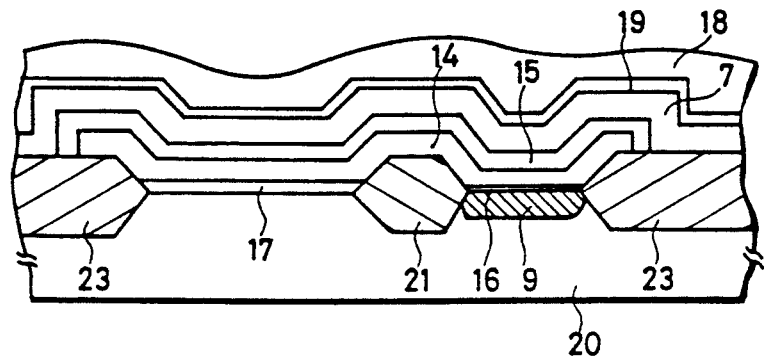
FIG. 1D is a cross sectional view showing a portion taken along the ID—ID of FIG. 1A.
Figures 2, 4:
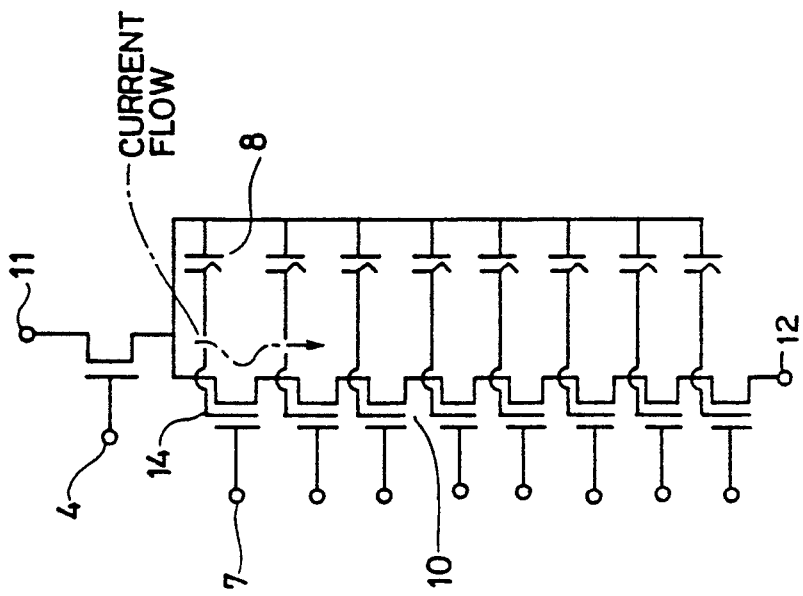
FIG. 2 is a schematic diagram showing the EEPROM shown in FIG. 1
FIG. 4 shows applied voltages in respective modes in the parallel circuit shown in FIG. 3.

With reference to FIG. 2, the read transistor region 10 is isolated from the tunnel region 8. Current will not flow through the tunnel region as shown in FIG. 2. Therefore, the tunnel voltage is not influenced by the threshold values of the transistors formed in series. Therefore, the threshold value of a plurality of memory transistors in each memory block is the same. Consequently, the operational characteristics of the EEPROM become uniform.

In addition, since the tunnel region is provided separately, the difficulty in manufacturing the tunnel region in the conventional improved NAND type EEPROM can be cleared. Therefore, an EEPROM which can be manufactured through a simple method can be provided.

II. Operation of the NAND type EEPROM in accordance with the present invention.

(1) Operation of a single EEPROM memory cell and a parallel circuit including 4 strings.

The operation of the EEPROM in accordance with the present invention will be described with reference to FIGS. 1A to 5. Let us assume that a plurality of memory blocks (hereinafter referred as string ST when each memory block has to be distinguished) $ST_{11}$ to $ST_{22}$ are arranged as shown in the FIG. 3. Reference characters $W_1$ and $W_2$ represent word lines, $C_{11}$, $C_{12}$ ... $C_{13}$ represent control gate lines of 8 memory transistors constituting strings $ST_{11}$ and $ST_{12}$, $C_{21}$ ... $C_{28}$ represent control gate lines corresponding to $C_{11}$ ... $C_{18}$ belonging to another strings $ST_{21}$ and $ST_{22}$, $B_1$ and $B_2$ represent bit lines, $S_1$, and $S_2$ represent source line and $M_{111}$, $M_{121}$, ... represent memory transistors.

The operation of the memory transistor $M_{111}$ belonging to a string $ST_{11}$ on the upper half in the left of FIG. 3 including memory transistors $M_{111}$ to $M_{181}$ will be described.

Figure 3:
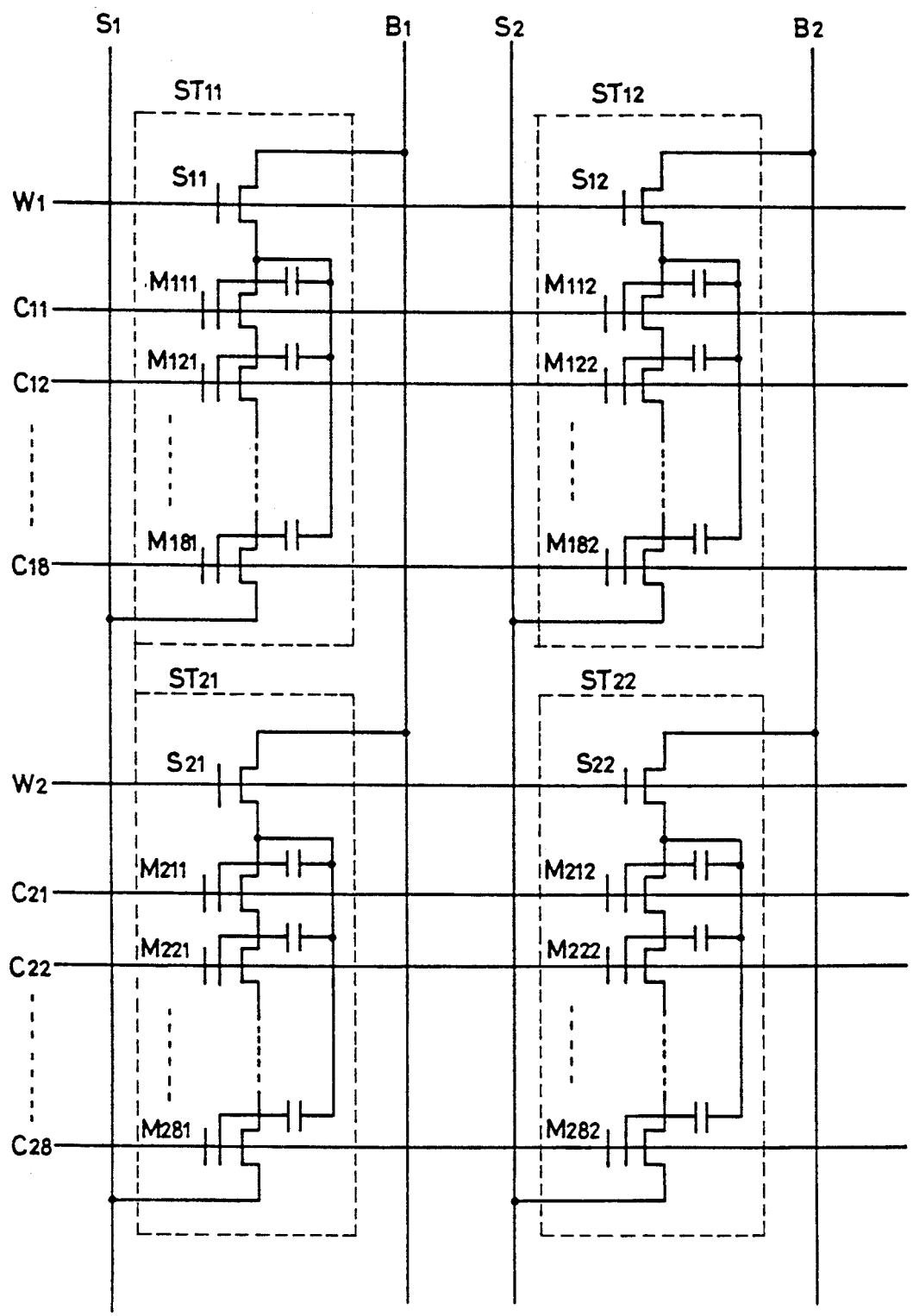
FIG. 3 is a parallel circuit diagram constituted by 4 string memory cell circuits in accordance with the present invention.
Figure 5:
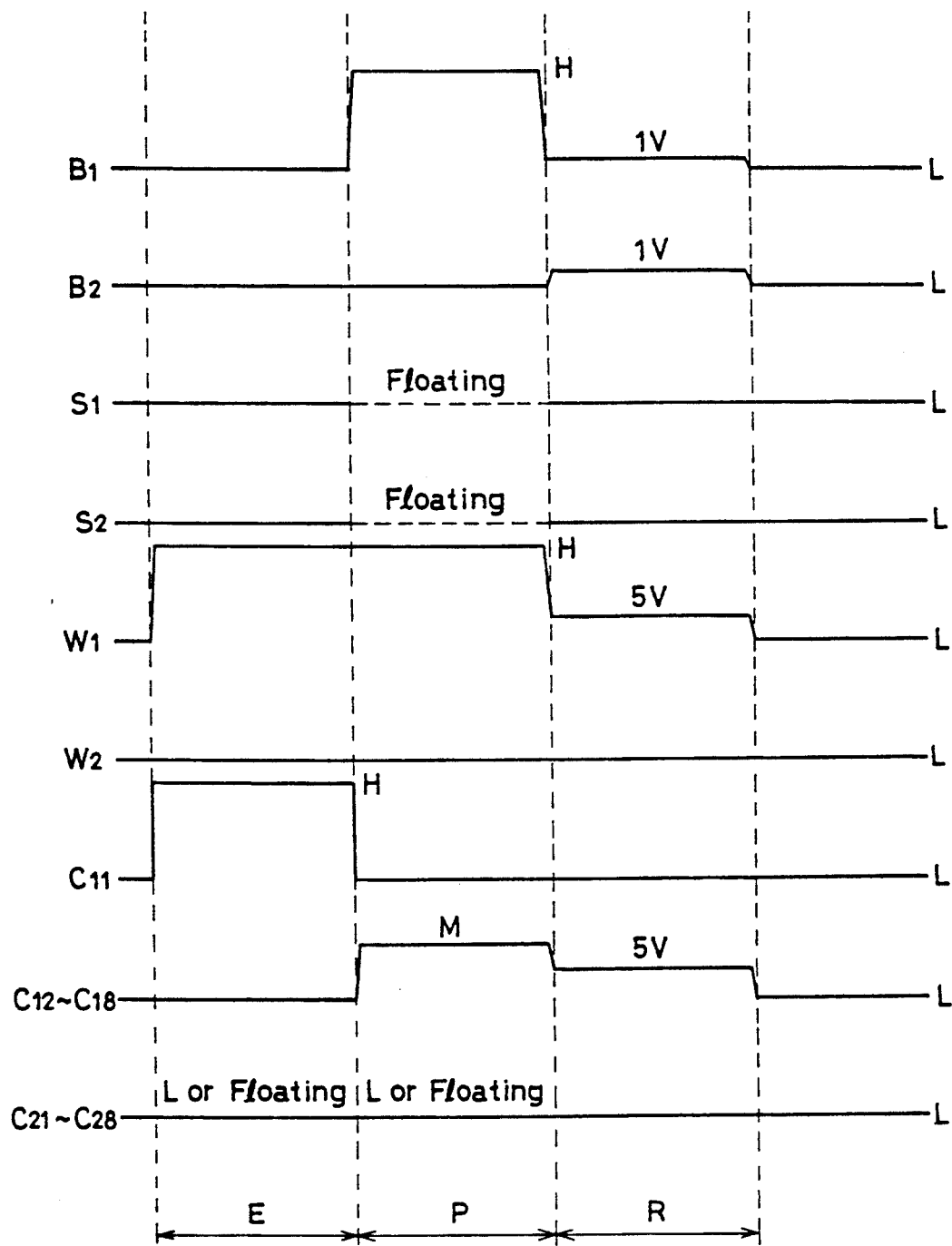
FIG. 5 is a timing chart in respective modes of the parallel circuit shown in FIG. 3.
Figure 6:
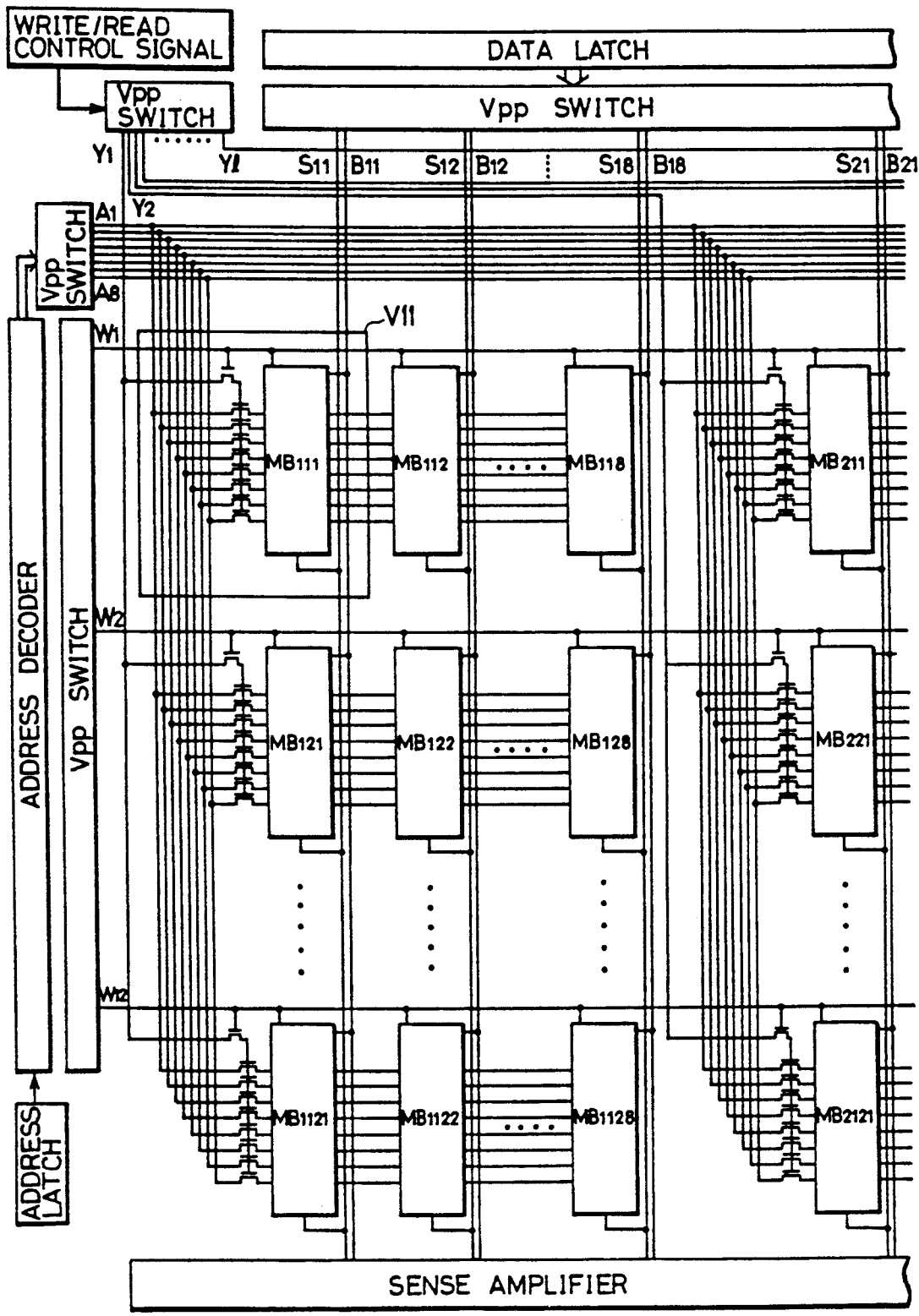
FIG. 6 is a block diagram of an EEPROM constituted by the EEPROM memory cell circuits in accordance with the present invention.
Figure 7:
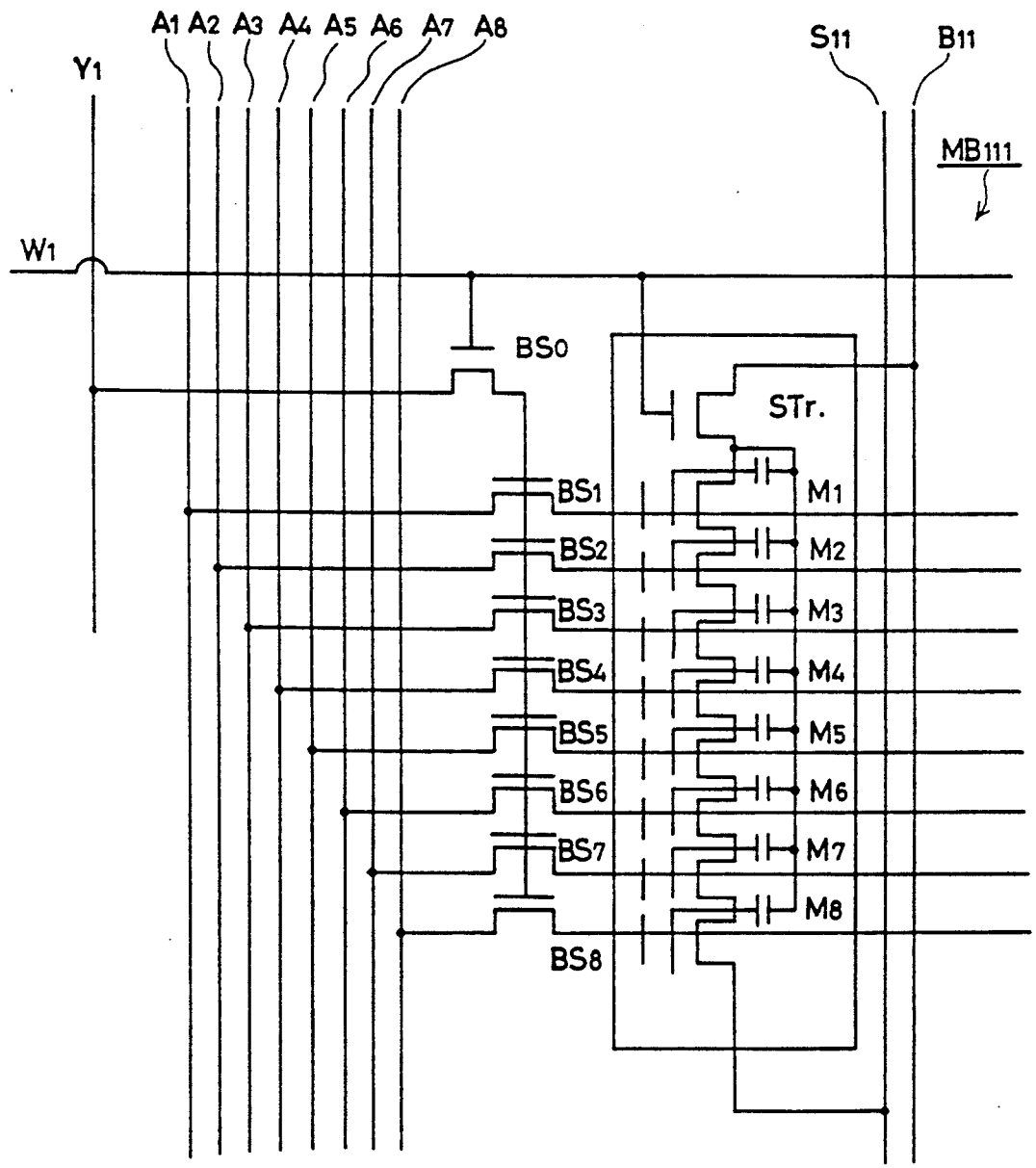
FIG. 7 is an enlarged circuit view of a portion shown by an arrow VII of FIG. 6.
Figure 9A:
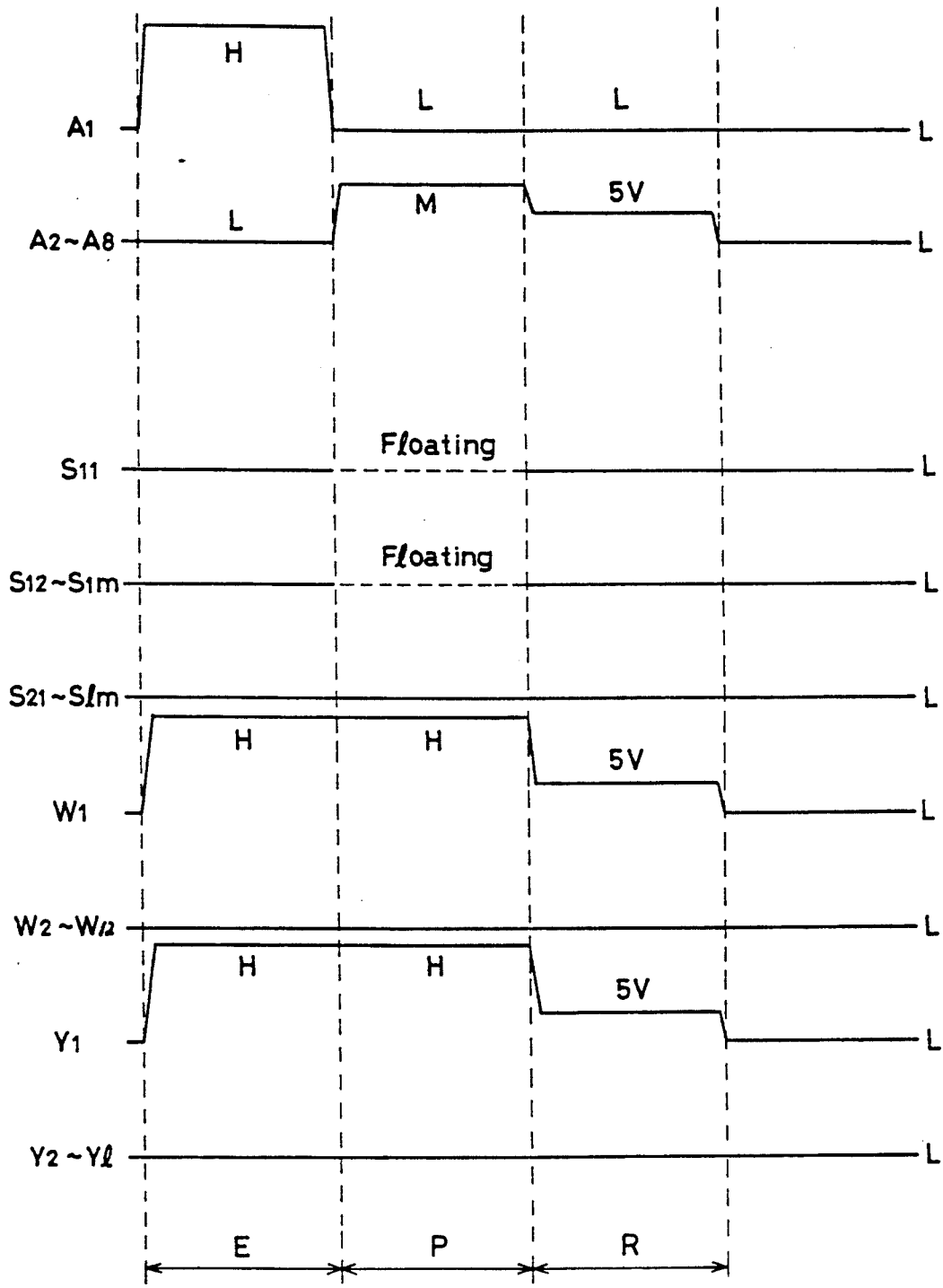
FIGS. 9A and 9B are timing charts of respective modes of the EEPROM shown in FIG. 6.
Figure 9B:
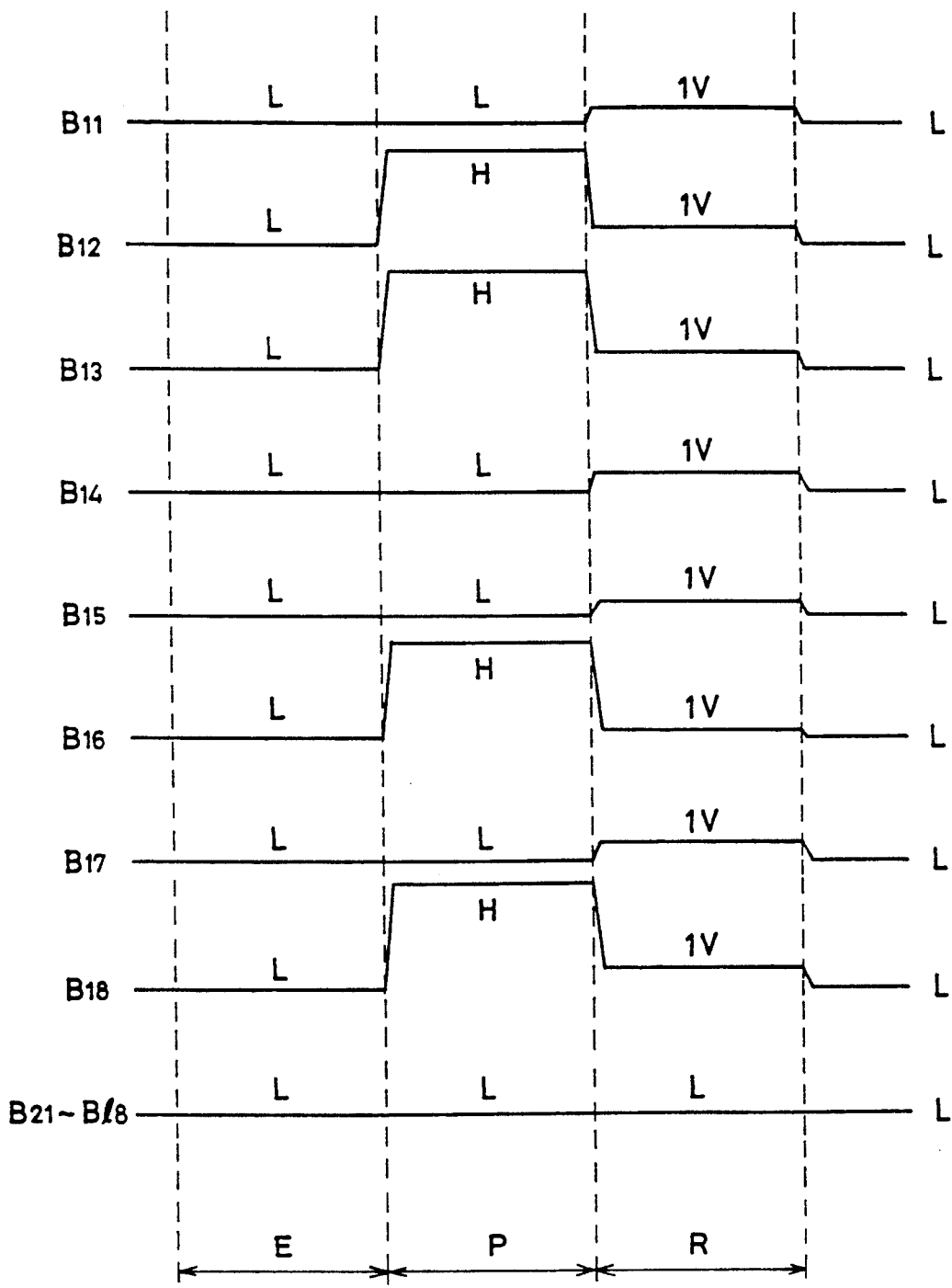

Referring to FIGS. 4 and 5, a portion represented by E corresponds to (i) an enhancement writing (erasing) mode in which all memory transistors ($M_{111}$, $M_{112}$ ... ) in the direction of $C_{11}$ as viewed in FIG. 3 are set at "1". The portion represented by P corresponds to (ii) a depletion writing (writing) mode in which "0" in written only in the memory transistor $M_{111}$. The portion represented by R corresponds to (iii) a reading mode in which the data stored in the memory transistors sharing $C_{11}$ control gate is read. The reference characters H, L and M correspond to a high level, a low level and an intermediate level potential, respectively. An example of these levels are shown under the table in FIG. 4.

(i) Enhancement writing mode

Enhancement writing mode for only one memory cell will be described at first.

In enhancement writing, the silicon semiconductor substrate 20, the drain region 1 and the source region 2 are grounded, that is, set at 0V state. A voltage higher than the threshold voltage of the selecting transistor 3 is applied to the selecting gate electrode 4. The impurity diffused layer 5 for connection, the memory connecting impurity diffused layer 22 and the tunnel impurity diffused layers 9 are set at 0V state. Enhancement writing in the memory block 24 is carried out and a voltage of about 19V is applied to the control gate 7 of a memory transistor 6 which is to be set at "1" state. The control gate 7 of the memory transistor 6 to which enhancement writing operation is not carried out is set at 0V potential. In the memory transistor 6 with the potential of about 19V applied to the control gate 7, there will be an electric field of about 13 MV/cm provided from the floating gate 14 to the tunnel impurity diffused layer 9 due to the capacitance dividing function of the coupling capacitance of the plurality of capacitors formed by the control gate 7, the floating gate 14, the silicon semiconductor substrate 20 and the tunnel impurity diffused layer 9. Electrons are introduced from the tunnel impurity diffused layer 9 to the floating gate 14 by this electric field. Consequently, the threshold value of the memory transistor 6 is increased to the "1" state. Meanwhile, in the memory transistor 6 with the potential of 0V applied to the control gate 7, introduction of electrons is not carried out since there is no electric field between the floating gate 14 and the tunnel impurity diffused layer 9. Therefore, the threshold value remains as it is.

Enhancement writing to the non-selected memory transistor 6 of other memory blocks 24 sharing the control gate 7, to which the potential of about 20V is applied, and to the selected gate electrode 4, to which a voltage higher than the threshold voltage of the selected transistor 3 is applied, must be prevented. Therefore, the potential of the drain region 1 of the memory block 24 in which the said non-selected memory transistors 6 are included is set at an intermediate potential higher than 0V, for example about 10V. Consequently, the F-N tunnelling phenomenon in the tunnel region 8 of the said non selected memory transistors 6 is suppressed, preventing the enhancement writing.

When enhancement writing is to be simultaneously carried out to the memory transistors 6 of other memory blocks 24, the potential of the drain regions 1 of the said other memory blocks 24 is set at 0V. An electric field of about 13MV/cm is applied from the floating gate 14 to the tunnel impurity diffused layer 9 of the memory transistors 6 in the said other memory block 24. Consequently, enhancement writing is carried out.

When all memory transistors $M_{111}$, $M_{112}$ ... in the direction of $C_{11}$ in FIG. 3 are to be erased to "1", a high voltage is applied to the word line $W_1$ to turn on the selecting transistor $S_{11}$ and the like. A high voltage is u applied to the control gate 7 of $C_{11}$ to turn on the memory transistors in the direction of $C_{11}$. Consequently, electrons are introduced to the floating gates 14, whereby all memory transistors in the direction of $C_{11}$ are simultaneously set at "1".

(ii) Depletion write mode

When depletion writing is to be carried out on the memory transistor $M_{111}$, a high voltage of about 20V is applied to the drain region 1 from the bit line $B_1$ and to the selecting gate electrode 4 through the word line $W_1$, the selecting transistor 3 becomes conductive, and a potential of about 19V is applied to the impurity diffused layer 5 for connecting, the tunnel impurity diffused layers 9 and the memory connecting impurity diffused layer 22 in the tunnel region. The source region 2 is electrically opened to be in a floating state. On this occasion, the control gate 7 of the memory transistor $M_{111}$ to which depletion writing is to be carried in the same memory block 24 is grounded ($C_{11}$ in FIG. 3) and an intermediated voltage higher than 0V, for example 10V is applied to the control gate 7 of the memory transistor 6 to which depletion writing is not carried out ($C_{12}$ to $C_{18}$ in FIG. 3).

In the tunnel region of the memory transistor 6 to which the depletion writing is to be carried out, there will be an electric field of about +14MV/cm, for example, provided from the tunnel impurity diffused layer 9 to the floating gate 14 through the tunnel insulating film 16, due to the capacitance dividing function of the potential of 19V applied on the tunnel impurity diffused layer 9 and the ground potential, that is, 0V on the control gate electrode 7. Consequently, a small current flows from the tunnel impurity diffused layer 9 to the floating gate 14 due to the F-N tunnelling phenomenon, the electrons in the floating gate 14 are introduced to the tunnel impurity diffused layer 9, and therefore the floating gate 14 is positively charged.

In a memory transistor 6 to which depletion writing is not carried out in the same memory block 24, there will be an electric field of about 8MV/cm, for example, provided from the floating gate 14 to the tunnel impurity diffused layer 9 due to the capacitance dividing function of the potential of the control gate 7, that is, 10V and the potential on the tunnel impurity diffused layer 9, that is, 19V. The electric field is not strong enough to effectively cause the F-N tunnelling. More specifically, the electric field is not strong enough to change the state from "1" to "0" by fully drawing out electrons from the floating gate 14. Therefore, the state of the data remains as it is. All control gates 7 in the memory block 24 can be simultaneously grounded. Namely, all memory transistors 6 in the memory block 24 can be simultaneously set at "0" by drawing out electrons simultaneously from all floating gates 14 of all memory transistors 6 in the same memory block 24 by F-N tunnelling phenomenon.

In the EEPROM of the present invention, the voltage applied to the non-selected control gate line in depletion writing is at an intermediate potential, unlike the conventional improved EEPROM in which 20V was applied. Consequently, erroneous writing can be prevented in the memory transistors adjacent to the non-selected memory transistor. Therefore an EEPROM which operates reliably can be provided.

(iii) Reading mode

In reading data, a voltage of about 5V, which is higher than the threshold voltage of the selecting transistor 3 to be selected is applied to the selecting gate electrode 4 of the selecting transistor 3 in the memory block 24. A voltage of about 1 to 5V is applied to the drain region 1. In reading data of the $M_{111}$ transistor, for example, the control gate electrode 7 ($C_{11}$) of the selected memory transistor 6 ) from which data is to be read is set at 0V, and a gate voltage higher than the threshold voltage of the memory transistor 6 in the enhancement state, for example a potential of about 5V, is applied to the control gate 7 ($C_{12}$ to $C_{18}$) of the non-selected memory transistors 6 in the said memory block 24. Consequently, a plurality of non-selected memory transistors 6 are simultaneously rendered conductive. If the selected memory transistor 6 is in the enhancement state, it does not become conductive even when the potential of the control gate 7 is 0V. Therefore, no current flows between the drain region 1 and the source region 2, so that we can see that the selected memory transistor $M_{111}$ is in "1" state. If the selected memory transistor is in the depletion state, it becomes conductive even when the control gate potential is 0V. Therefore, a current flows between the drain region 1 and the source region 2, so that we can see that the selected transistor is in "0" state.

(2) Operation of a circuit having parallel byte structure

· Operation of a circuit having parallel byte structure employing the EEPROM memory cell circuit in accordance with the present invention (memory cell in which 1 byte is formed in a direction different from that of an NAND column) will be described in the following with reference to FIGS. 6 to 9A and 9B. One bit of each of the strings $MB_{111}$ to $MB_{118}$ is used to constitute 1 byte. The operation will be described in the following assuming that $M_1$ transistors (transistors located at the uppermost portion of each string) of the strings $MB_{111}$ to $MB_{118}$ constitute one byte.

(i) Description of the ERASE operation

Data of each of the memory cells of one byte constituted by the transistors $M_1$ are all set at "0" at first. This state is attained by applying a potential "H" only to the address line $A_1$. The "H" level is applied to the word line $W_1$ and the selecting line $Y_1$ connected to the gate electrode of the byte selecting transistor $BS_0$. The potential "H" on the address line $A_1$ is applied to the eight gate electrodes of $M_1$ transistors of the strings $MB_{111}$ to $MB_{118}$. Since the potentials on the the lines $B_{11}$ to $B_{18}$ are set to bit "L" level and the potential of the word line $W_1$ is set to the "H" level, the level of the tunnel impurity diffused layers 9 of the strings $MB_{112}$ to $MB_{118}$ are set to "L". Consequently, by the F-N tunneling, electrons are introduced to the flating gates of the eight $M_1$ transistors. Consequently, data of 1 byte are all erased. Since the "H" level potential is not applied to the gates of the non-selected memory transistors, erroneous writing can be prevented.

(ii) Description of the "PROG" operation

Simultaneous writing of data "10011010", for example, into eight $M_1$ transistors of $MB_{111}$ to $MB_{118}$ constituting 1 byte will be described hereinafter. The writing can be realized by applying potential LHHLLHLH to the bit lines $b_{11}$ to $B_{18}$, respectively. An "L" level potential is applied to the address line $A_1$ and "H" level potential is applied to the word line $W_1$ and the selecting line $Y_1$, so that the control gate electrodes of the selected eight $M_1$ memory transistors are fixed to the "L" level. Consequently, electrons are excessively drawn out from the floating gates of the selected memory transistors, to the tunnel impurity diffused layers 9 of which the "H" level potential is applied. Therefore, "0" is written these memory cells. Meanwhile, the movement of electrons do not move in the selected memory transistors to the tunnel impurity diffused layers 9 to which the "L" level potential is applied. Therefore, the state "1" is maintained in these memory cells. As a result, the data "10011010" are written in the eight $M_1$ transistors of $MB_{111}$ to $MB_{118}$. An "M" level (corresponding to the medium potential about 10V) voltage is applied to the control gate lines of the non-selected transistors in the selected strings $MB_{111}$ to $MB_{118}$ through address lines $A_2$ to $A_8$. The "M" level voltage is applied through the byte selecting transistors $BS_2$ to $BS_8$ by the application of the "H" level potential to the selecting line $Y_1$ and to the word line $W_1$. Therefore, no effective F-N tunneling occurs for both "H" and "L" levels of the tunnel impurity diffused layer 9, thereby preventing erroneous writing. Since the byte selecting transistor $BS_0$ or the string selecting transistor $ST_r$ is turned off, erroneous writing can be prevented in all the non-selected strings.

(iii) Description of the READ operation

The reading mode will be described hereinafter Data of each of the memory cells of 1 byte constituted by the transistors $M_1$ are read. A potential of about 1V is applied to all the selected bit lines $B_{11}$ to $B_{18}$. On this occasion, a potential of 5V is applied to the non-selected address lines. 5V is applied to the word line $W_1$ and to the selecting line $Y_1$, so that the non-selected memory transistors $M_2$ to $M_8$ in the strings selected by the byte selecting transistors $BS_2$ to $BS_8$ are all turned on regardless of the state of the data. On this occasion, 0V is applied to the gate electrodes of the selected eight memory transistors $M_1$ through the selected address line $A_1$. Consequently, whether the current flows to the bit line or not is determined dependent on the state ("0" or "1") of the memory transistors $M_1$ Consequently, reading of the data is carried out. In all the non-selected strings, the string selecting transistors $ST_r$ are all turned off by the application of "L" level voltage to the word lines $W_2$ to $W_{12}$, so that the erroneous reading can be prevented.

(3) Reading operation in the parallel byte structure

Reading operation of the memory cell array having the parallel byte structure, in which the characteristics of the EEPROM of the present invention are best exhibited, will be described hereinafter.

Figure 11:
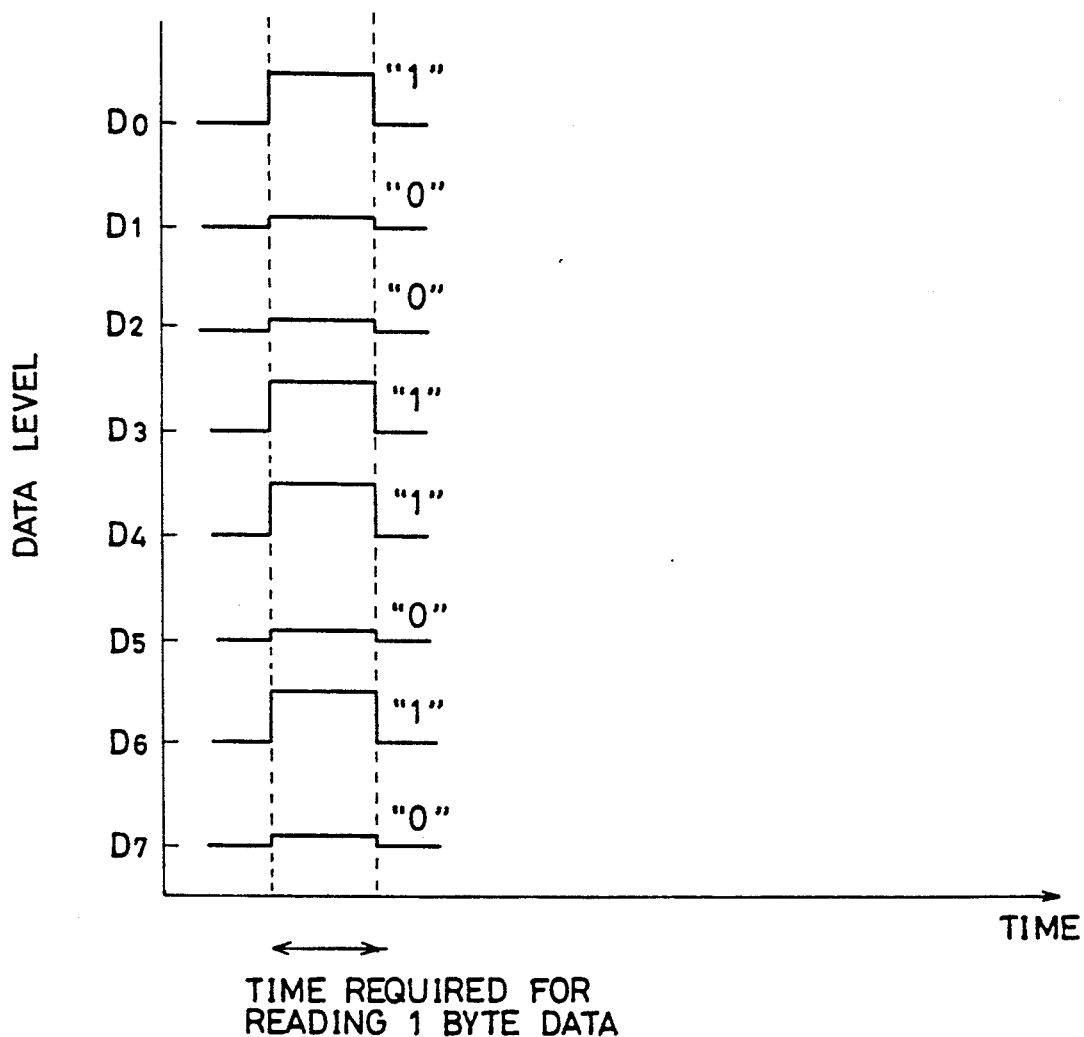
FIG. 11 is a timing chart in the reading mode of the memory cell circuit shown in FIG. 10.
Figure 12:
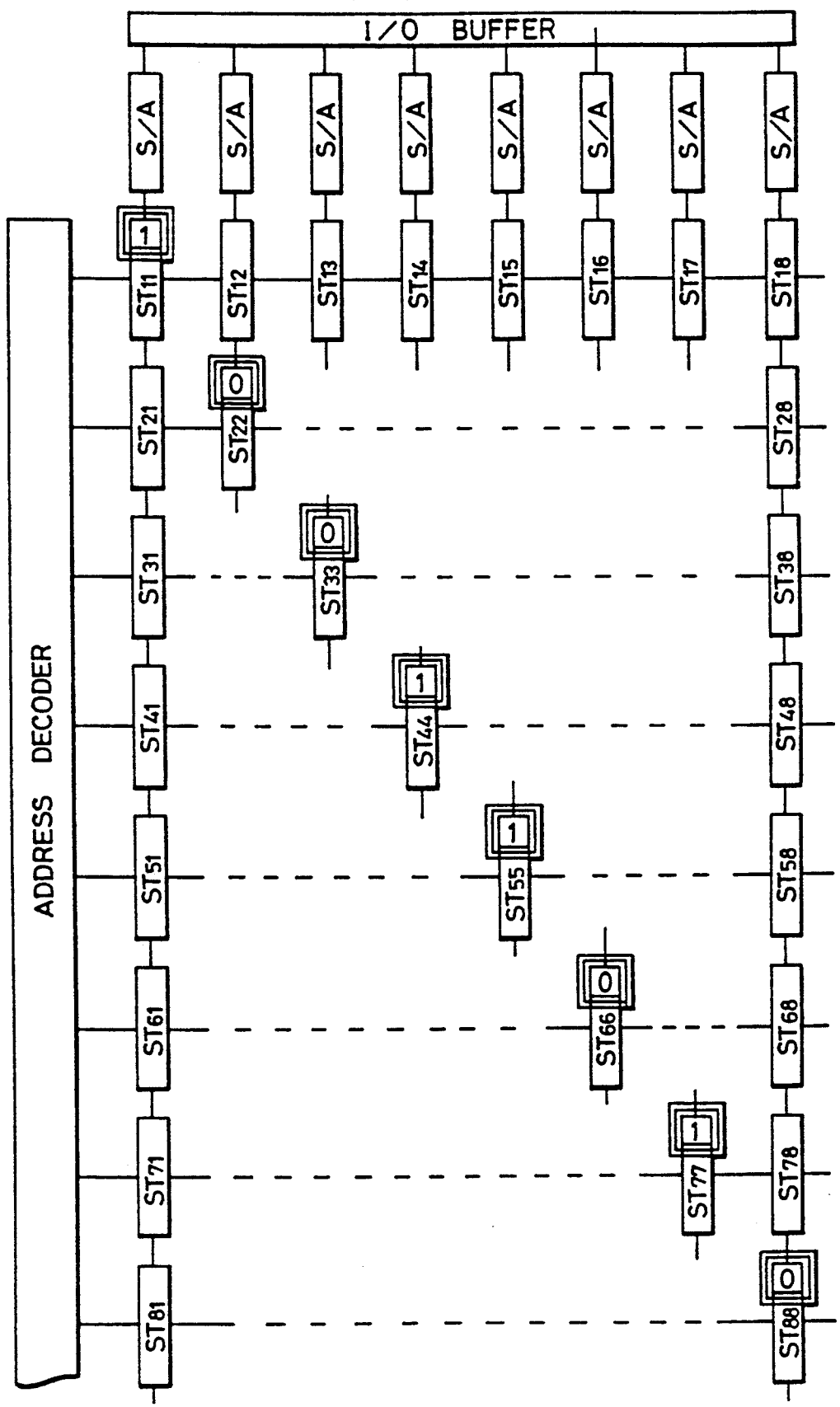
FIG. 12 is a modification of the memory cell circuit having the parallel byte structure in accordance with the present invention.
Figure 13:
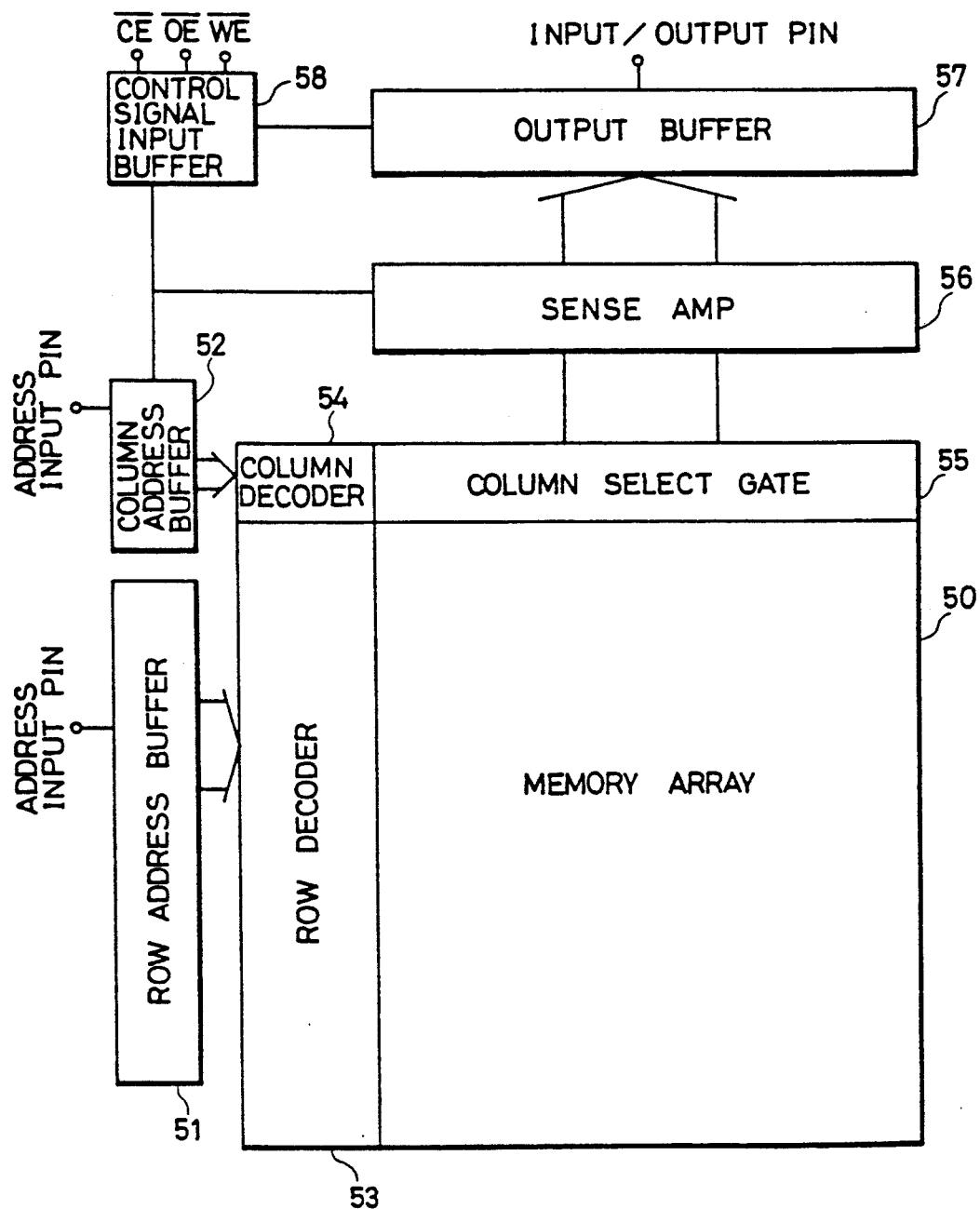
FIG. 13 is a block diagram showing a conventional EEPROM.
Figure 14:
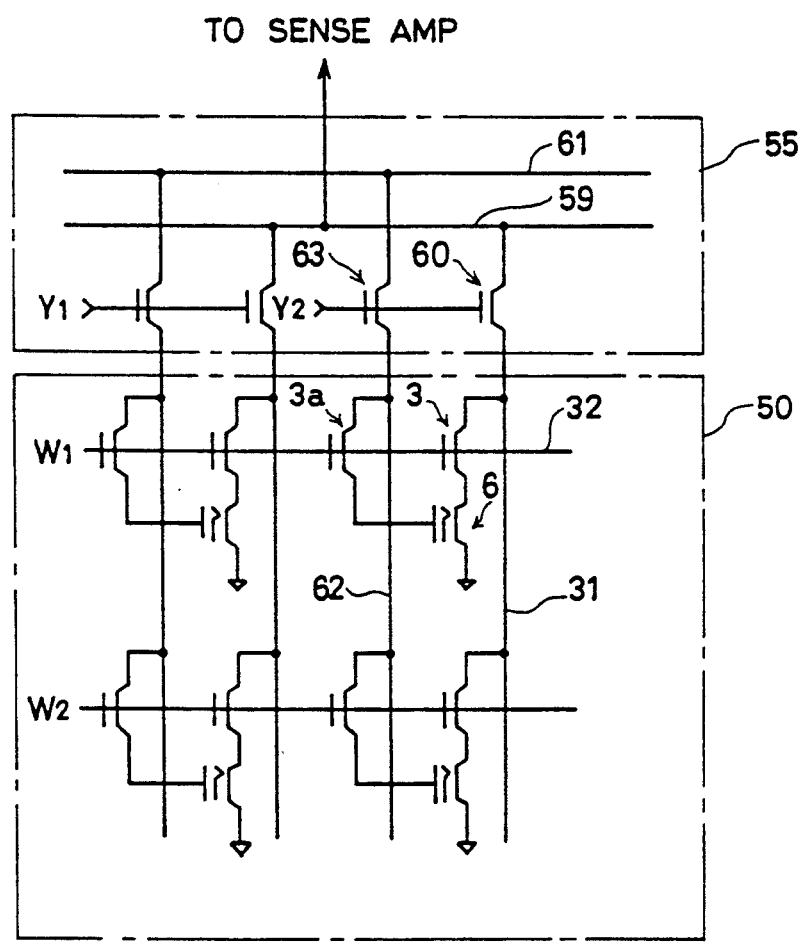
FIG. 14 is a schematic diagram showing an example of a memory cell array shown in FIG. 13.
Figure 23:
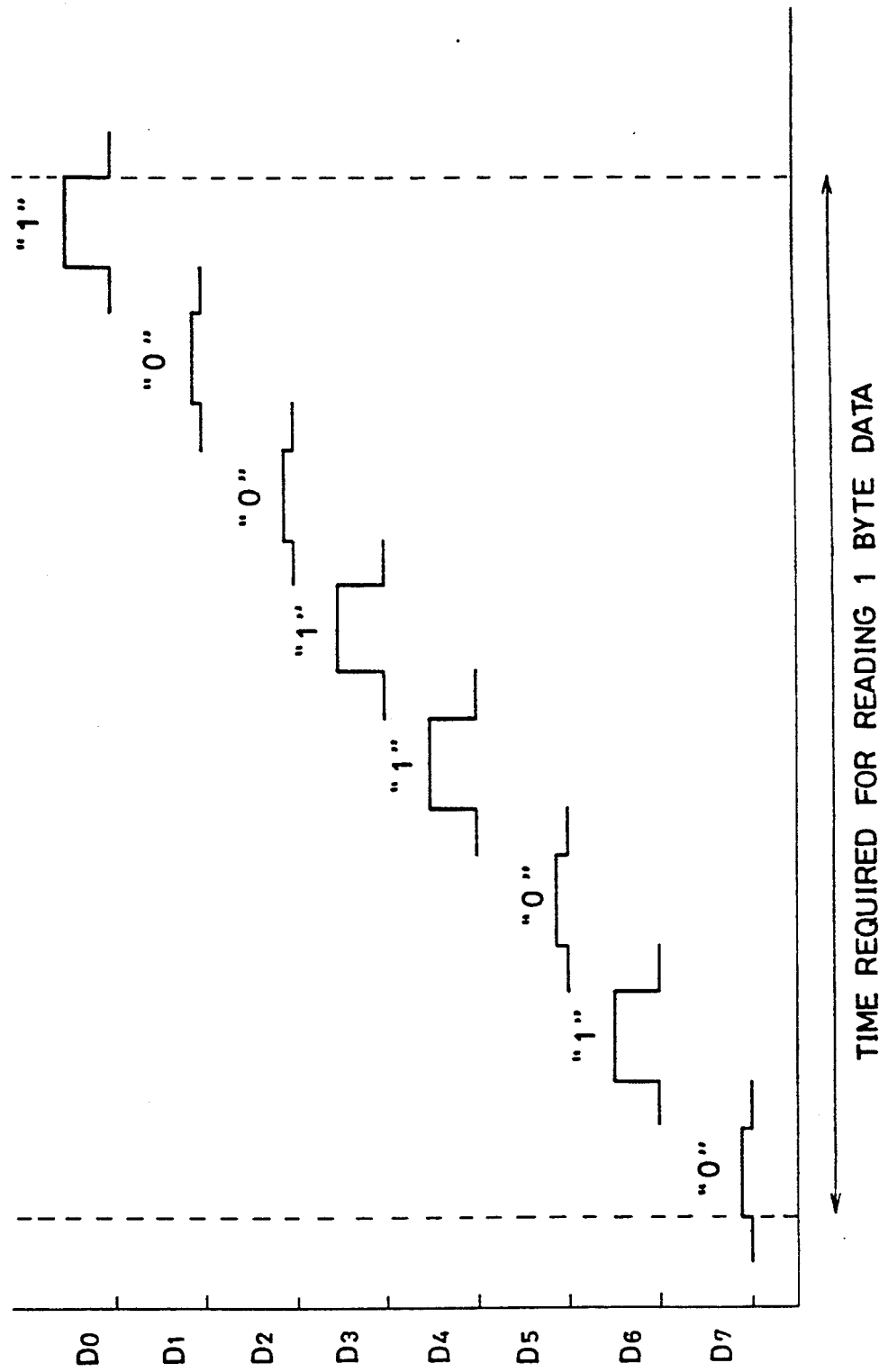
FIG. 23 is a timing chart of the reading mode of the EEPROM shown in FIG. 22.

Referring to FIG. 10, the portion surrounded by the double solid lines ($D_0, D_1, \ldots D_7$) constitute 1 byte. It is assumed that the data "10011010" are inputted in 1 byte ($D_0 \ldots D_7$). Each of the bits constituting 1 byte is included in each of eight NAND column strings $ST_{11}$ to $ST_{18}$. A sense amplifier is arranged in series to each string ST, so that by connecting a group of eight sense amplifiers (8 strings) to one input/output buffer, 1 byte data ($D_0, D_1, \ldots D_7$) can be read by one reading operation. This is illustrated in FIG. 11. Compared with the serial byte structure shown in FIG. 23, the time required for parallel reading can be reduced to ⅛ of the serial read time. The reason for this is that the writing/erasing of data can be collectively carried out in a direction (word line direction) orthogonal to the direction of the strings. In addition, since the writing/erasing of a single 1 bit data can be carried out, each of the eight strings arranged on different word lines may comprises 1 bit memory cell to constitute 1 byte, as shown in FIG. 12. In the figure, portions surrounded by the double solid lines constitute 1 byte, and the data "10011010" are inputted in $D_0$ to $D_7$ The timing diagram for the reading mode is the same as FIG. 11.

As described above, in the NAND type EEPROM of the present invention, writing/erasing of memory transistors which are not in one memory block but are arranged in a parallel direction orthogonal thereto can be simultaneously carried out. Consequently, 1 byte of memory cells can be formed by a plurality of memory transistors in a direction different from the direction of 1 memory block.

Therefore, unlike the conventional improved EEPROM, there is no need to sequentially read all bit information. Consequently, an EEPROM can be provided whose access time is short.

One selecting transistor 3 formed of one selecting gate electrode 4 is provided in one memory block 24 in the foregoing. The selecting gate electrode 4 may be divided into two, and the channel selecting transistor and the tunnel selecting transistor may be separately provided. One drain electrode 11 is used for both writing and reading in the above described embodiment.

Separate drain electrodes for the read transistor region 10 and for the tunnel region 8 may be provided.

The number of transistors 6 in the memory block 24 may be two or more, although 8 memory transistors 6 are included in one memory block 24 in the foregoing.

As described above, in the semiconductor memory device of the present invention, one selecting gate electrode and a set of source-drain electrodes are shared by a plurality of memory transistors, and the tunnel region for writing and erasing signal charges to each of the plurality of memory transistors is separated from the read transistor region for reading presence/absence of the signals. Consequently, the memory cell itself can be made smaller, since one selecting gate electrode and a set of source-drain electrodes are shared by a plurality of memory transistors. In addition, since the tunnel region and the read transistor region are separated from each other, the threshold values of the plurality of memory transistors can be maintained constant, without being influenced by the number of the memory transistors.

Consequently, a semiconductor memory device which can be highly integrated with uniform operational characteristics can be provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A NAND type electrically erasable programmable read only memory, comprising:
   a semiconductor substrate having a main surface;
   a first plurality of memory cell means connected in series on the main surface of said semiconductor substrate, each memory cell means having a floating gate for storing charges representing information; and
   selecting means for selecting a group of said memory cell means from said first plurality of memory cell means;
   wherein each said memory cell means includes
   (a) floating gate state changing means for changing a state of said floating gate between a first state and a second state, said floating gate state changing means comprising
   a tunnelling structure having Fowler-Nordheim tunnelling phenomenon formed in a first portion of the main surface of said semiconductor substrate, an independently addressable control gate formed n said floating gate with an insulating film disposed therebetween, and a tunnel insulating film between said tunnelling structure and said floating gate said floating gate being substantially aligned with said control gate, and
   (b) floating gate state determining means for determining whether said floating gate is in the first charge state or the second charge state said floating gate state determining means comprising:
   said control gate, said flating gate, a gate oxide silicon film between said floating gate and the main surface of said substrate isolated from said tunnel insulating film, a memory connecting impurity diffused layer in a second portion of the main surface of said substrate, and a read transistor region formed in said second portion of said semiconductor substrate, said second portion of said substrate being non-overlapping with said first portion of said substrate.

2. A NAND type electrically erasable programmable read only memory, comprising:
   a semiconductor substrate having a main surface;
   an array of memory cell means comprising a plurality of groups of memory cell means, each group including a number of memory cell means connected in series on the main surface of said semiconductor substrate, each memory cell means having a floating gate for storing charges representing information, wherein each said memory cell means includes
   (a) floating gate state changing means for changing a state of said floating gate between a first charge state and a second charge state, said floating gate state changing means comprising
   a tunnelling structure having Fowler-Nordheim tunnelling phenomenon formed in a first portion on the main surface of said semiconductor substrate, an independently addressable control gate formed on said floating gate with an insulating film disposed therebetween, and a tunnel insulating film between said tunnelling structure and said floating gate said floating gate being substantially aligned with said control gate, and
   (b) floating gate state determining means for determining whether said floating gate is in the first charge state or the second charge state said floating gate state determining means comprising
   said control gate, said floating gate, a gate oxide silicon film between said floating gate and the main surface of said substrate isolated from said tunnel insulating film, a memory connecting impurity diffused layer in a second portion of the main surface of said substrate, and a read transistor region formed in said second portion of said semiconductor substrate, said second portion of said substrate being non-overlapping with said first portion of said substrate;
   selecting means for selecting in common corresponding memory cell means from at least two of said groups of memory cell means, said selecting means including a first impurity region and a second impurity region; and,
   means for establishing a current flow path through said floating gate state determining means for reading said floating gate state, said current flow path bypassing said floating gate state changing means said means for establishing a current flow path comprising
   all said control gates in said first plurality of memory cells means, all said read transistor regions in said first plurality of memory cell means, said first impurity region and said second impurity region.

3. A NAND type electrically erasable programmable read only memory, comprising:
   a semiconductor substrate having a main surface;
   a first plurality of memory cell means connected in series on the main surface of said semiconductor substrate, each memory cell means including a floating gate for storing charges representing information, wherein each said memory cell means includes
   (a) a floating gate state changing means for changing a state of said floating gate between a first state and a second state, said floating gate state changing means comprising, a tunnel impurity diffused layer formed in a first portion of the main surface of said semiconductor substrate and connected to a first potential, an independently addressable control gate means formed on said floating gate with an insulating film disposed therebetween and connected to a second potential, and a tunnel insulating film between said tunnel impurity diffused layer and said floating gate, said floating gate being substantially aligned with said control gate, and (b) floating gate state determining means for determining whether said floating gate is in the first state or the second state, said floating gate state determining means comprising said control gate, said floating gate, a gate oxide silicon film between said floating gate and the main surface of said substrate isolated from said tunnel insulating film, a memory connecting impurity diffused layer in a second portion of the main surface of said substrate, and a read transistor region formed in said second portion of said semiconductor substrate, said second portion of said substrate being non-overlapping with said first portion of said substrate;

selecting means for selecting a group of said memory cell selecting means including first impurity region and a second impurity region; and means for establishing a current flow path through said floating gate state determining means for reading said floating gate state, said current flow path bypassing said floating gate state changing means, said means for establishing current flow comprising all said control gates in said first plurality of memory cells means, all said read transistor regions in said first plurality of memory cell means, said first impurity region and said second impurity region.

4. A NAND type electrically erasable programmable read only memory according to claim 3 wherein said floating gate state changing means sets said floating gate at said first state by setting said second potential at a prescribed potential higher than said first potential, and at said second state by setting said first potential at a prescribed potential higher than said second potential.

5. A NAND type electrically erasable programmable read only memory, comprising:

a semiconductor substrate having a main surface;

an array of memory cell means comprising a plurality of groups of memory cell means, each group including a number of memory cell means connected in a series path on the main surface of said semiconductor substrate, each memory cell means having a floating gate for storing charges representing information; and selecting means for selecting in common corresponding memory cell means form at least two of said groups of memory cell means;

wherein each said memory cell means includes (a) floating gate state changing means for changing a state of said floating gate between a first charge state and a second charge state, said floating gate state changing means comprising a tunnelling structure having Fowler-Nordheim tunnelling phenomenon formed in a first portion of the main surface of said semiconductor substrate, an independently addressable control gate formed on said floating gate with an insulating film disposed therebetween, and a tunnel insulating film between said tunnelling structure and said floating gate said floating gate being substantially aligned with said control gate, and (b) floating gate state determining means for determining whether said floating gate is in the first charge state or the second charge state said floating gate state determining means comprising said control gate, said floating gate, a gate oxide silicon film between said floating gate and the main surface of said substrate isolated from said tunnel insulating film, a memory connecting impurity diffused layer in a second portion of the main surface of said substrate, and a read transistor region formed in said second portion of said semiconductor substrate, said second portion of said substrate being non-overlapping with said first portion of said substrate.

6. A NAND type electrically erasable programmable read only memory, comprising:

a semiconductor substrate having a main surface;

a plurality of memory cell means connected in series on the main surface of said semiconductor substrate, each memory cell means including a floating gate for storing charges representing information, wherein each said memory cell means constitute (a) a floating gate state changing means for changing a state of said floating gate between a first state and a second state, said floating gate state changing means comprising tunnel impurity diffused layer formed in a first portion of the main surface of said semiconductor substrate and connected to a first potential, an independently addressable control gate means formed on said floating gate with an insulating film disposed therebetween and connected to a second potential, and a tunnel insulating film between said tunnel impurity diffused layer and said floating gate, said floating gate being substantially aligned with said control gate, and (b) floating gate state determining means for determining whether said floating gate is in the first state or the second state, said floating gate state determining means comprising said control gate, said floating gate, a gate oxide silicon film between said floating gate and the main surface of said substrate isolated from said tunnel insulating film, a memory connecting impurity diffused layer in a second portion of the main surface of said substrate, and a read transistor region formed in said second portion of said semiconductor substrate, said second portion of said substrate being non-overlapping with said first portion of said substrate;

selecting means for selecting a group of said memory cell means from said plurality of memory cell means, said selecting means including a first impurity region and a second impurity region with said plurality of memory cell means arranged therebetween; and means for establishing a current flow path through said floating gate state determining means for reading said floating gate state, said current flow path bypassing said floating gate state changing means, said means for establishing current flow comprising all said control gates in said first plurality of memory cells means, all said read transistor regions in said first plurality of memory cell means, said first impurity region and said second impurity region.

7. A method of processing data in a NAND type EEPROM memory comprising:

a semiconductor substrate having a main surface;

an array of memory cell means comprising a plurality of groups of memory cell means, each group including a number of memory cell means connected in a series path on the main surface of said semiconductor substrate, each cell means having a floating gate for storing charges representing information; and selecting means for selecting in common corresponding memory cell means from at least two of said groups of memory cell means;

wherein each said memory cell means includes (a) floating gate state changing means for changing the state of said floating gate between a first state and a second state, said floating gate state changing means comprising a tunnelling structure having Fowler-Nordheim tunnelling phenomenon formed in a first portion of the main surface of said semiconductor substrate, an independently addressable control gate formed on said floating gate with an insulating film disposed therebetween, and a tunnel insulating film between said tunnelling structure and said floating gate said floating gate being substantially aligned with said control gate, and (b) floating gate state determining means for determining whether said floating gate is in the first charge state or the second charge state said floating gate state determining means comprising said control gate, said floating gate, a gate oxide silicon film between said floating gate and the main surface of said substrate isolated from said tunnel insulating film, a memory connecting impurity diffused layer in a second portion of the main surface of said substrate, and a read transistor region formed in said second portion of said semiconductor substrate, said second portion of said substrate being non-overlapping with said first portion of said substrate, said method comprising the steps of:

addressing simultaneously corresponding memory cell means in at least two of said groups of memory cell means, the memory cell means addressed thereby forming a byte of memory cells; and selectively writing said data into and erasing said data from said corresponding memory cell means.

8. A method of operating a NAND type EEPROM memory comprising:

a semiconductor substrate having a main surface;

memory cell means connected in series on the main surface of said semiconductor substrate, each memory cell means having a floating gate for storing charges representing information, floating gate state changing means for changing a state of said floating gate between a first charge state and a second charge state, said floating gate state changing means comprising a tunnelling structure having Fowler-Nordheim tunnelling phenomenon formed on a first portion of the main surface of said semiconductor substrate, an independently addressable control gate formed on said floating gate with an insulating film disposed therebetween, and a tunnel insulating film between said tunnelling structure and said floating gate said floating gate being aligned with said control gate, and floating gate state determining means for determining whether said floating gate is in the first charge state or the second charge state, said floating gate state determining means comprising said control gate, said floating gate, a gate oxide silicon film between said floating gate and the main surface of said substrate isolated from said tunnel insulating film, a memory connecting impurity diffused layer in a second portion of the main surface of said substrate, and a read transistor region formed in said second portion of said semiconductor substrate, said second portion of said substrate being non-overlapping with said first portion of said substrate, said method comprising the steps of:

selectively applying a prescribed first potential in an erase mode to said floating gate state changing means so that charge is removed from said floating gate;

selectively applying prescribed second and third potentials in a write mode to said floating gate state changing means so that charge is applied or removed selectively from said floating gate; and selectively applying a prescribed fourth potential lower than said first potential in a read mode to said floating gate state changing means so that any charge on said floating gate is transferred to a bit line.

9. A method of operating a NAND type EEPROM memory comprising:

a semiconductor substrate having a main surface;

memory cell means connected in series on the main surface of said semiconductor substrate, each memory cell means having a floating gate for storing charges representing information, each said memory cell means including floating gate state changing means for changing a state of said floating gate between a first charge state and a second charge state, said floating gate state changing means comprising a tunnelling structure having Fowler-Nordheim tunnelling phenomenon formed on a first portion of the main surface of said semiconductor substrate, an independently addressable control gate formed on said floating gate with an insulating film disposed therebetween, and a tunnel insulating film between said tunnelling structure and said floating gate said floating gate being aligned with said control gate, each said memory cell means also including floating gate state determining means for determining whether said floating gate is in the first charge state or the second charge state, said floating gate state determining means comprising said control gate said floating gate, a gate oxide silicon film between said floating gate and the main surface of said substrate isolated from said tunnel insulating film, a memory connecting impurity diffused layer in a second portion of the main surface of said substrate, and a read transistor region formed in said second portion of said semiconductor substrate, said second portion of said substrate being non-overlapping with said first portion of said substrate, said method comprising the steps of:

selectively applying a prescribed first potential to said floating gate state changing means so that charge is selectively removed from said floating gate of selected memory cell means;
selectively applying a prescribed second potential to said floating gate state changing means so that charge is selectively applied to said floating gate of selected memory cell means; and
selectively applying a prescribed third potential, intermediate in value to said first and second potentials to said control gate of non-selected memory means so that charge on said floating gate of non-selected memory cell means is not changed.

* * * * *